United States Patent [19]
Zimmerman et al.

[11] Patent Number: 5,530,409
[45] Date of Patent: Jun. 25, 1996

[54] SIGNAL PROCESSING ALLOCATOR

[75] Inventors: Joel A. Zimmerman, Parsippany Township, Morris County, N.J.; Ruloff F. Kip, Jr., New Castle, N.Y.

[73] Assignee: AT&T Corp., Murray Hill, N.J.

[21] Appl. No.: 175,987

[22] Filed: Dec. 30, 1993

Related U.S. Application Data

[63] Continuation-in-part of Ser. No. 140,809, Oct. 21, 1993, abandoned.

[51] Int. Cl.$^6$ ........................................ H01P 5/12
[52] U.S. Cl. .................... 333/100; 455/53.1; 361/732; 379/59
[58] Field of Search ..................... 333/100, 117, 333/124, 136; 455/33.1, 33.3, 53.1, 90, 127, 128, 129, 11.1; 379/59; 361/730, 731, 732, 733

[56] References Cited

U.S. PATENT DOCUMENTS

| | | | |
|---|---|---|---|
| 2,602,842 | 7/1952 | Morris et al. | 361/732 X |
| 4,227,094 | 10/1980 | Semur et al. | |
| 4,342,002 | 7/1982 | Gabr | 361/730 X |
| 4,618,831 | 10/1986 | Egami et al. | |
| 4,694,484 | 9/1987 | Atkinson et al. | 455/33.3 X |
| 4,755,776 | 7/1988 | Preschutti | |
| 4,941,200 | 7/1990 | Leslie et al. | 455/53.1 X |
| 5,023,902 | 6/1991 | Anderson et al. | |
| 5,267,297 | 11/1993 | Kawano et al. | |

FOREIGN PATENT DOCUMENTS 1075372  2/1984  U.S.S.R. .

OTHER PUBLICATIONS

Erlich et al., "Cell–Site Hardware," *The Bell System Technical Journal*, vol. 58, No. 1, Jan. 1979, pp. 153–199.

Primary Examiner—Benny T. Lee
Assistant Examiner—Justin P. Bettendorf

[57] ABSTRACT

A central interconnector unit provides for the possible transfer therethrough of RF signals passing in $\underline{m}$ signal paths from respective signal sources to respective antennas disposed at a cellular telephony cell site to radiate those signals into different angular sectors of the site. The unit has a total capacity for amplifying such signals which is provided by $\underline{n}$ similar circuit pack amplifying sections ($\underline{n}$ being greater than $\underline{m}$), having respective inputs and outputs connected to corresponding jack terminals on a backplane in the unit. Associated with the unit are a pool of $\underline{p}$ signal divider-combiner modules ($\underline{p}$ being greater than $\underline{m}$) which each include (a) source and load terminals for exteriorly connecting the module to one of such sources and antennas, (b) a row of pairs of input and output section terminals pluggable into said jack terminals to connect the module to one or more of said sections and (c) divider and combiner units respectively connecting the source and load terminals of the module to, respectively, all input section terminals thereof and all output section terminals thereof. Different of the modules in the pool have different numbers of pairs of input and output section terminals. Different combination of $\underline{m}$ modules are withdrawable from the pool and insertable into the interconnector unit to allocate different fractions of said total amplifying capacity among different of said $\underline{m}$ signal paths.

15 Claims, 10 Drawing Sheets

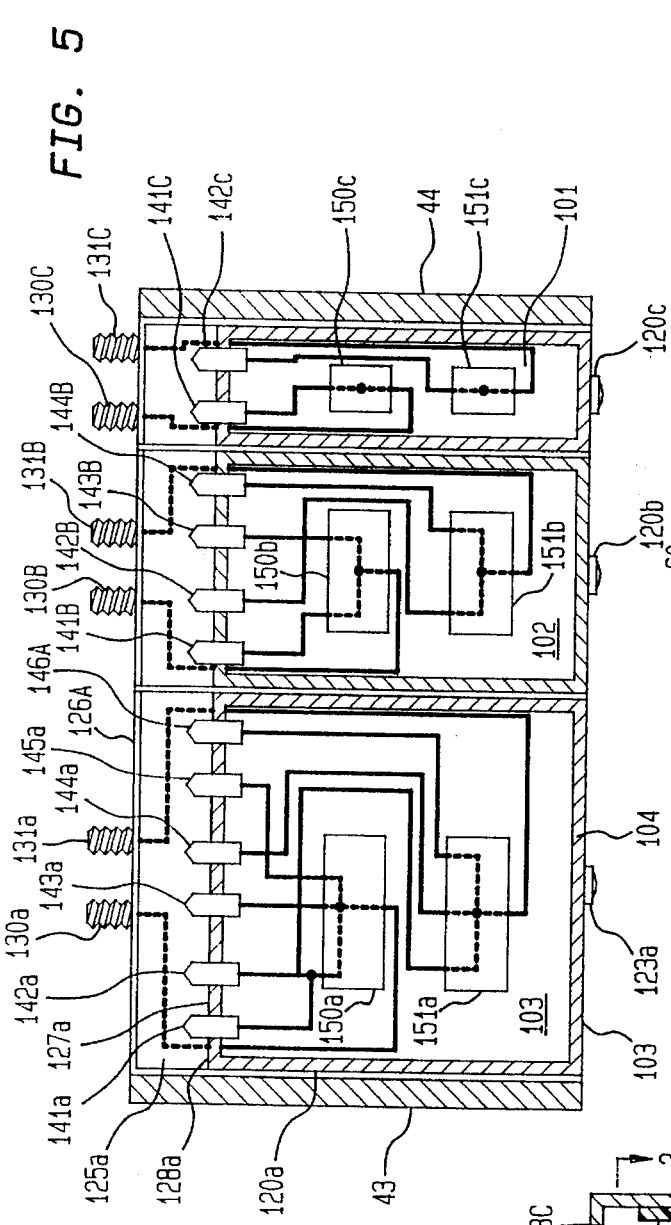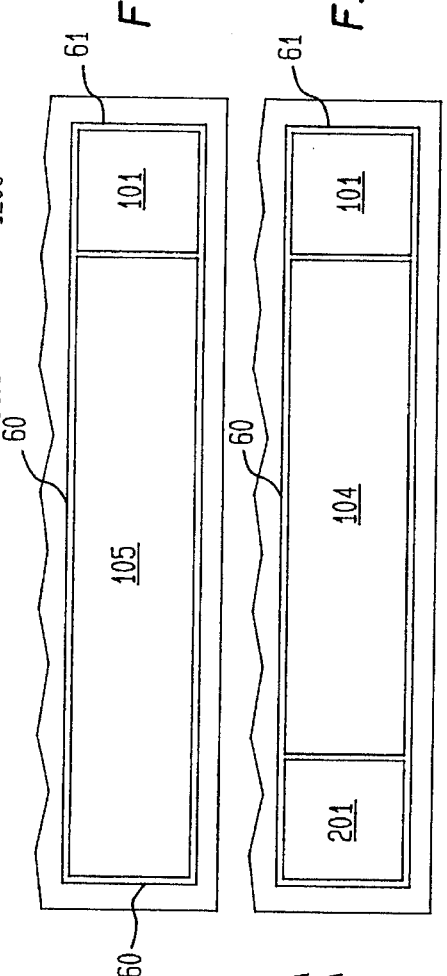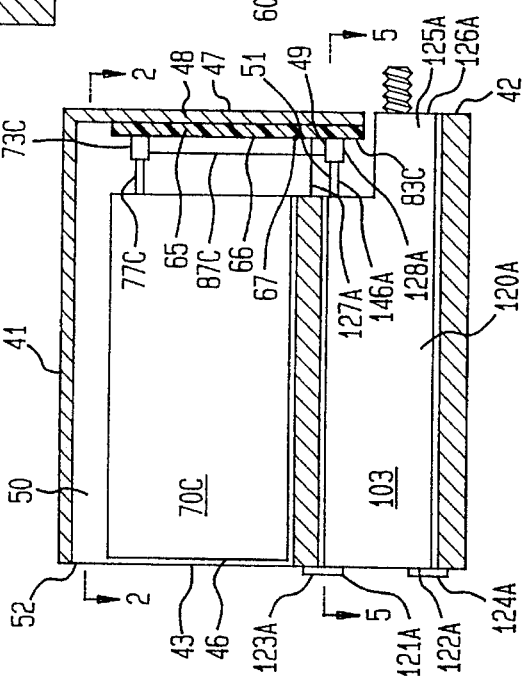

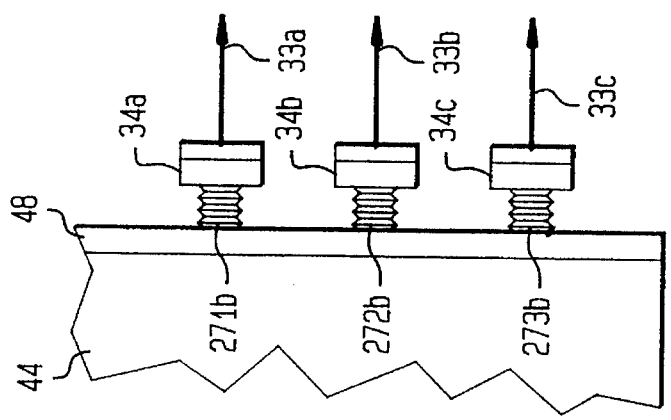
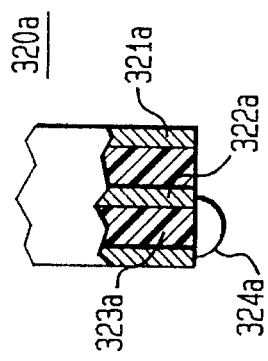
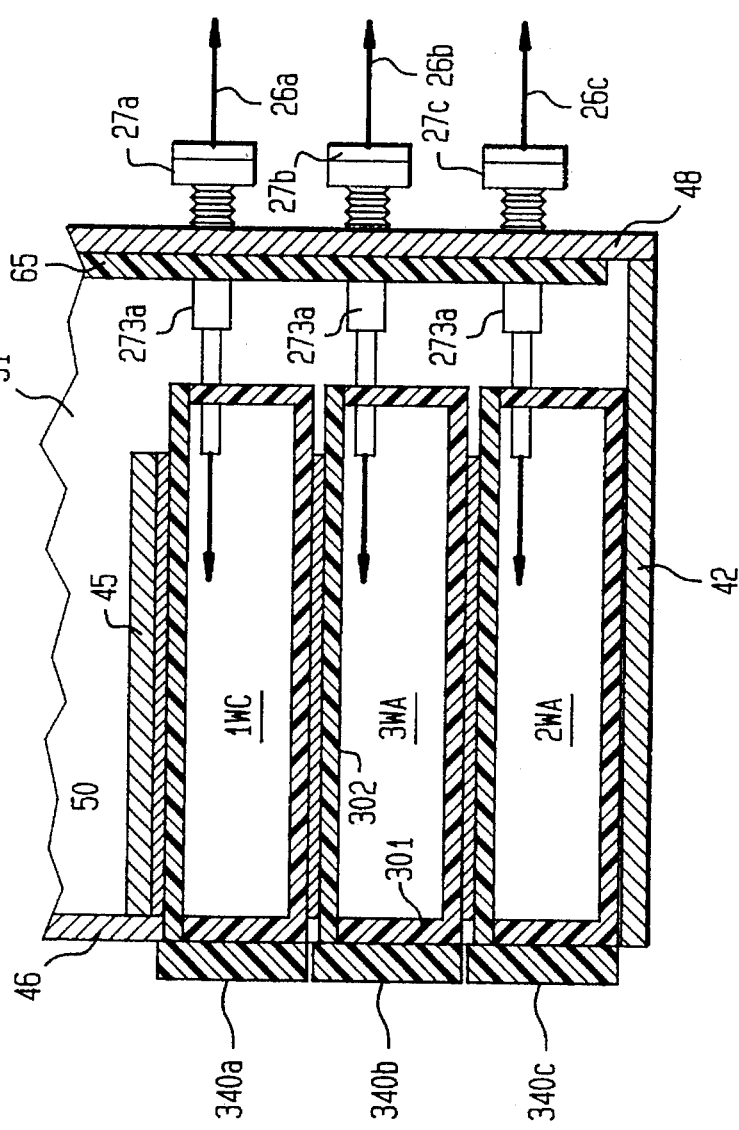

5,530,409

SIGNAL PROCESSING ALLOCATOR

RELATED APPLICATIONS

This application is a continuation-in-part of U.S. patent application Ser No. 08/140,809, now abandoned filed Oct. 21, 1993 in the name of Joel A. Zimmerman for "Allocation of Signal Processing Capability Among Different Signal Paths", and assigned to the assignee hereof.

FIELD OF THE INVENTION

This invention relates, generally, to the allocation of various fractions of the total of an available signal processing capacity into various paths for signals extending between a source and a load for said signals and, more particularly, to the use of different combinations of modules for effecting different allocations of such capacity among such various paths.

BACKGROUND OF THE INVENTION

Electrical systems often comprise multiple sources of signals which are transferred in signal paths from such sources to loads for those signals, and which signals require similar signal processing in those paths in selectably different amounts before such signals are transferred to their loads. Assuming that there is a fixed total signal processing capacity available to fulfill that requirement, one way to satisfy it is to divide the total capacity into a plurality of similar circuit sections which are greater in number than said paths and all perform the same signal processing function, and to then selectively allocate different numbers of said circuit sections to different ones of said paths as required. That selective allocation often requires, however, the making of a great number of electrical connections, the undertaking of which can be laborious and expensive in the absence of any means to facilitate it.

SUMMARY OF THE INVENTION

Such connection problem is solved according to the invention in the manner set out by the appended claims.

BRIEF DESCRIPTION OF DRAWINGS

For a better understanding of the invention, reference is made to the following description of an exemplary embodiment thereof, and to the accompanying drawings wherein.

FIG. 4 is a right side elevation in cross-section, taken as indicated by the arrows 4—4 in FIG. 2, of the FIG. 2 unit;

FIG. 5 is a plan view in cross-section, taken as indicated by the arrows 5—5 in FIG. 4, of the FIG. 2 unit when containing a particular combination of signal processing allocation modules;

FIGS. 6 and 7 are schematic partial front elevations of the FIG. 2 unit when containing other combinations of signal processing allocation modules;

FIG. 8 is a schematic diagram of the entire plurality of such modules which is provided in connection with the FIG. 2 unit for the purpose of inclusion in such unit of different combinations of such modules;

FIG. 15 is an enlarged plan view, partly broken to be in cross-section of one of the details shown in FIG. 14;

FIG. 16 is a right side elevation in cross-section, taken as indicated by the arrows 16—16 in FIG. 14 of the lower part of the FIG. 12 modification, taken as indicated by the arrows 17—17 in FIG. 14, when connected into the FIG. 1 system;

FIG. 17 is a fragmentary right side elevation of the rear part of the FIG. 12 modification when connected into the FIG. 1 system.

Figure 1:
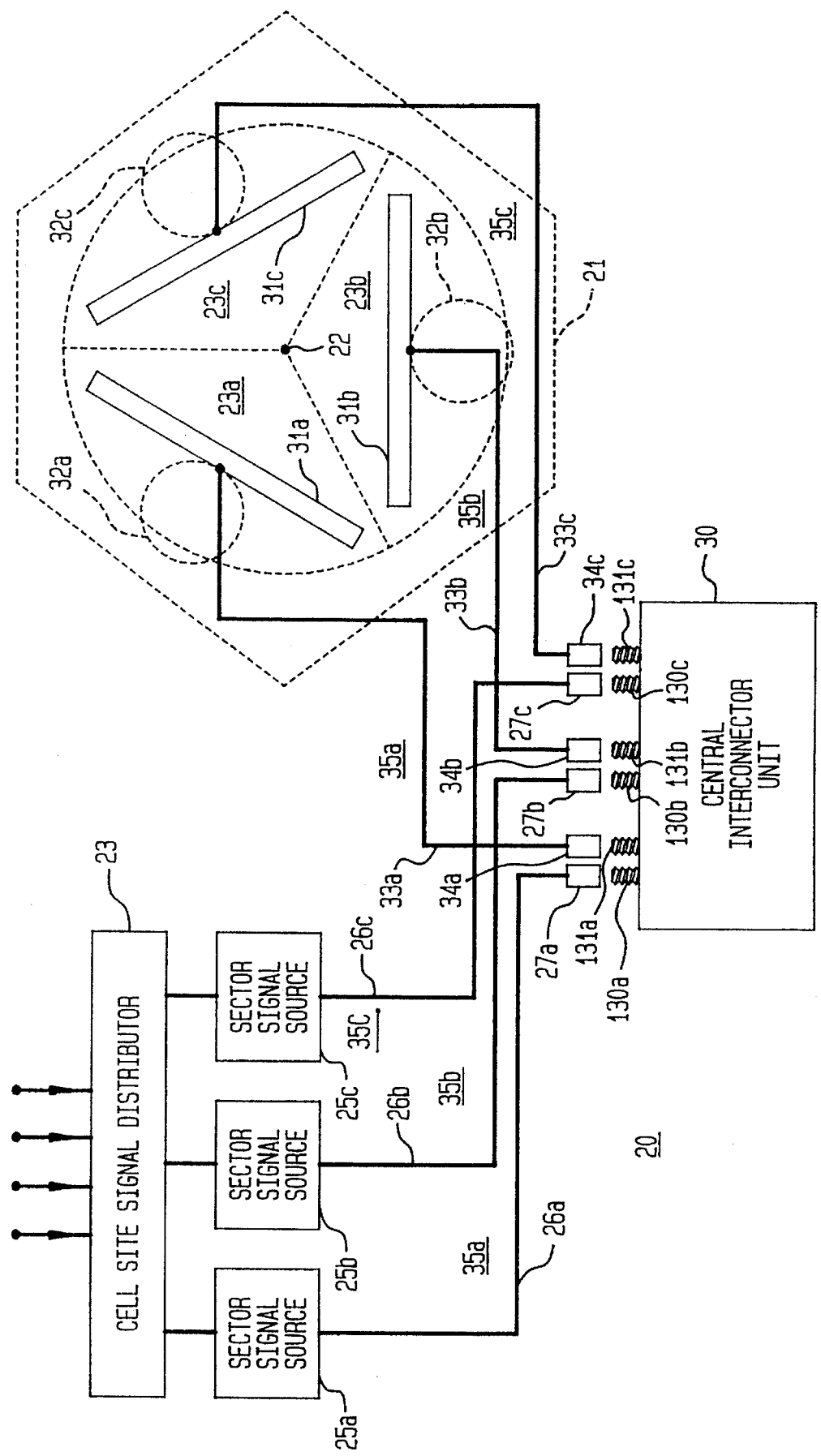
FIG. 1 is a schematic block diagram of an electrical system according to the invention.

In the description which follows, elements which are counterparts of each other are designated by the same reference numerals with different alphabetical suffixes being used to distinguish those elements from each other, and it is to be understood that a description of one of such elements shall, unless the context otherwise indicates, be taken as applying equally to all counterparts thereof. Moreover, while the specification and claims assume a particular spatial orientation for what is being described or claimed, it is to be understood that the invention hereof as disclosed and/or claimed is not limited to any particular spatial orientation thereof.

DETAILED DESCRIPTION OF THE EMBODIMENT

Figure 11:
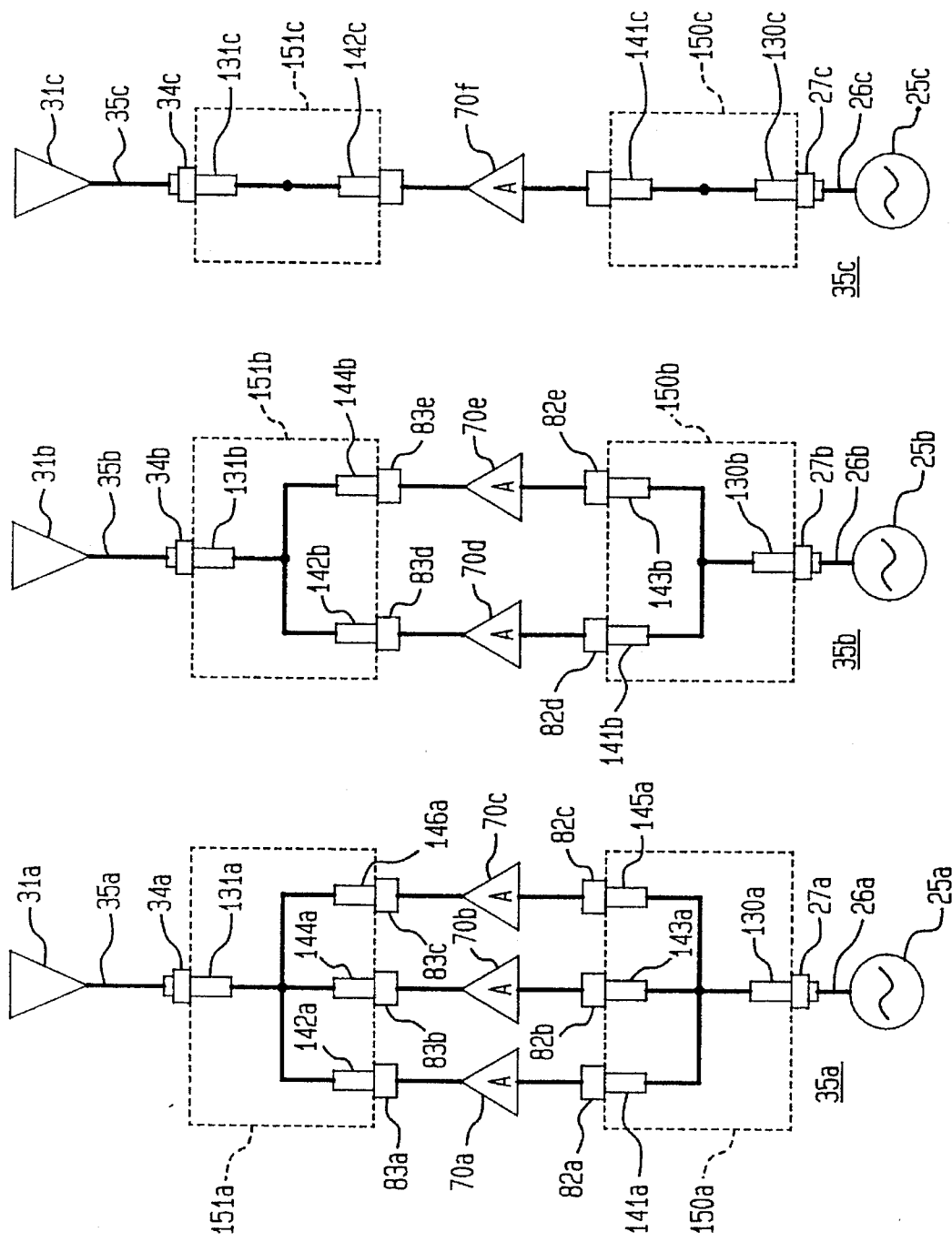
FIG. 11 is an electrical diagram of the FIG. 1 system when all electrical connections have been made therein to utilize in the system the particular combination of signal processing allocation modules shown in FIG. 5.

Referring now to FIG. 1, the reference numeral 20 designates an electrical base station system, according to the invention, which is utilized in cellular telephony at the base station for a particular cell site represented in FIG. 1 by the hexagon 21. In that system, incoming signals representing all the telephone traffic to be transmitted from that base station are received by a cell site signal distributor 23 and are distributed by that assemblage among $\underline{m}$ units 25a, 25b, 25C (where $\underline{m}$ here is the integer 3). Those units serve as sources of RF signals which are such incoming signals as modulated on a carrier, and those units each take the form in the FIG. 1 system of the stages of a microwave transmitter unit excluding the stage(s) for effecting final amplification, if needed, of those RF signals. The outputs of transmitter units 25a, 25b, 25c are adapted to be connected (and in FIG. 11 are shown as being connected) to a central interconnector unit 30 via coaxial conductors 26a, 26b, 26c having end couplings 27a, 27b, 27c at their free ends.

Also included in the FIG. 1 system are three loads for signals in the form of transmitting antennas 31a, 31b, 31c near the center 22 of cell site 21. The antennas 31 are distributed around that center to be disposed within different angular sectors 23a, 23b, 23c disposed around center 22. The three antennas face outward from center 22 and have respective directive radiation patterns 32a, 32b, 32c which are directed to radiate RF signals away from center 22 primarily into their respective sectors. There are $\underline{m}$ of such antennas. The RF signals to be transmitted by antennas 31a, 31b, 31c are supplied thereto via respective coaxial conductors 33a, 33b, 33c having at their free ends respective end couplings 34a, 34b, 34c by which the antennas 31 are adapted to be electrically connected (and are shown in FIG. 11 as being connected) to the central interconnector unit 30.

When all of conductors 26 and conductors 33 are connected to unit 30, the antennas 31a, 31b and 31c are connected through that unit with, respectively, the transmitter units 25a, 25b, 25c via respective signal paths 35a, 35b, 35c. Those paths 35a–35c constitute interconnecting means which comprises unit 30 and all of conductors 26 and 33. Within each of those paths 35, RF signals flowing from transmitters 25 through unit 30 to antennas 31 are subjected in unit 30 to amplification in amounts which are different in different of those paths, and which amounts are different fractions modularly allocated among those paths of a fixed total amplifying capability available in unit 30. The character and design of unit 30 which effects such modularly allocated amplification is as follows.

Figure 2:
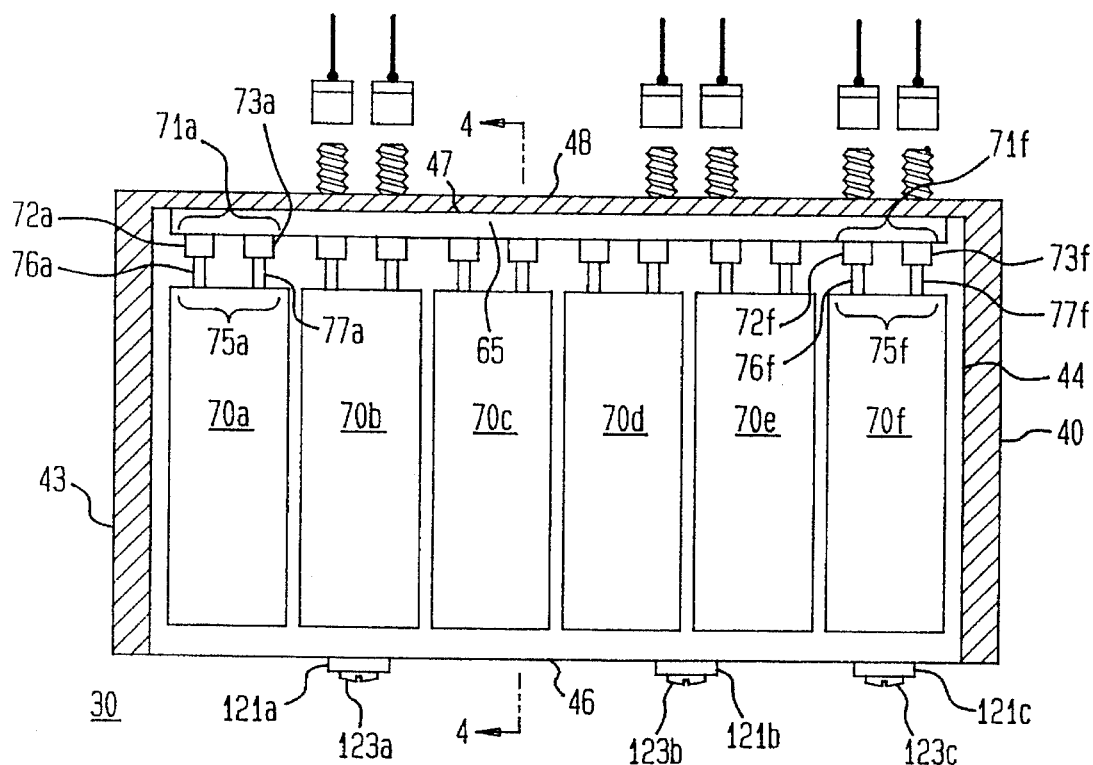
FIG. 2 is a plan view in cross-section, taken as indicated by the arrows 2—2 in FIG. 4, of a central interconnector included in the FIG. 1 system.

Referring to FIGS. 2–5, the central interconnector unit comprises a housing 40 (FIG. 2) having at first and second vertically opposite ends thereof a top closure wall 41 (FIG. 3) and a bottom shelf 42 (FIG. 3) which are joined by vertical side walls 43, 44 (FIG. 2) spaced apart from each other in the longitudinal horizontal dimensional coordinate. Those side walls support a middle shelf 45 (FIG. 3) vertically disposed intermediate the top 41 and bottom 42 of the housing. The housing 40 is open on its front side 46 (FIG. 2). The top wall 41 and the bottom shelves 42 extend in the transverse horizontal dimensional coordinate rearward from the front side 46 of the housing to its back side 47 (FIG. 2) to there have the top wall 41 be joined to a vertical back wall 48 (FIG. 2). The wall 48 extends vertically down from housing top 41 towards the back end of bottom shelf 42 but stops short of it to leave between the elements 48 and 42 a rear passage 49 (FIG. 4) extending longitudinally between the side walls 43, 44 and transversely forward into the interior of housing 40 from its exterior. Middle shelf 45 in extending transversely rearward from the housing front 46 stops short of back wall 48 to leave a space 51 (FIG. 4) between that shelf and wall.

The top wall 41 and middle shelf 45 are on vertically opposite sides of, and define between them, an upper bay 50 having a front access opening 52 (FIG. 4) and extending transversely rearward in housing 40 from that opening towards back wall 48. Also, the middle shelf 45 and bottom shelf 42, are on vertically opposite sides of, and define between them, a lower guideway 60 (FIG.4 ) extending transversely rearward in housing 40 from a rectangular entrance 61 (FIG. 3) for the guideway on the front side 46 of the housing. Entrance 61 has longitudinally extending vertically spaced sides provided by the bottom and top, respectively, of the shelves 45 and 42, and the entrance has vertically extending longitudinally spaced sides provided by the inner sides of the housing side walls 43 and 44. Those walls serve as guide walls for the guideway 60.

Referring to FIG. 4, the back wall 48 of housing 40 has fastened thereto by securing means (not shown) an insulative backplane 65 extending vertically down from the top end of the housing. The backplane 65 has an upper portion 66 disposed at the back of bay 50, and it has a front side facing towards the access opening 52 of the bay. Below that upper portion, the backplane extends into and past space 51 to project down below middle shelf 45 so as to position between the vertically opposite sides of guideway 60 a lower backplane portion 67. That portion bounds the back end of the guideway and has a front side facing towards its entrance 61. That lower backplane portion 67 extends down only part way beyond middle shelf 45 to bottom shelf 42 so as to leave room for the rear passage 49 of the housing to extend transversely inward between the elements 67 and 42 and communicate with the guideway 60.

The bay 50 of housing 40 has therein an array of signal processing circuit sections 70a–70f (FIG. 3) supported by middle shelf 45. Those sections take the form in the FIG. 1 system of circuit packs providing respective circuits which are all similar and which all amplify RF signals supplied to their respective inputs thereof and then deliver the amplified signals as so amplified to their respective outputs. The circuit sections 70a–70f are $\underline{n}$ in number where $\underline{n}$ is an integer greater than $\underline{m}$ and, in the case of the FIG. 1 system, is the integer 6.

Figure 3:
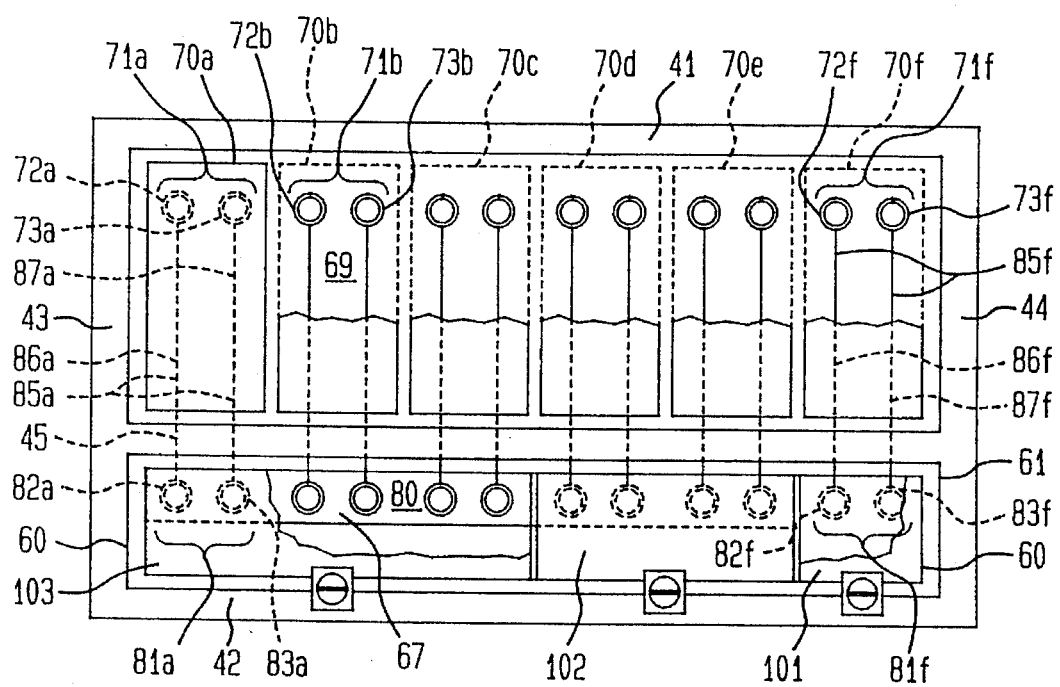
FIG. 3 is a front elevation of the FIG. 2 unit with some of the components thereof being broken away.

Referring to FIGS. 2 and 3, for the purpose of connecting the circuit sections 70a–70f into the system, the upper portion 66 of backplane 65 has thereon an array or row 69 of $\underline{n}$ pairs 71a–71f of receptor terminals which respectively correspond to those six circuit sections. Each pair of receptor terminals consists of an input receptor terminal 72 and an output terminal 73 for connection to, respectively, the signal input and the signal output of the corresponding circuit section. Thus, for the first circuit section 70a and the last circuit section 70f, there respectively correspond the two pairs 71a and 71f on backplane portion 66 of receptor terminals of which the terminal pair 71a consists of input and, output receptor terminals 72a, 73a, respectively, and of which the terminal pair 71f consists of the input and output receptor terminals 72f and 73f, respectively.

The pairs of receptor terminals 71 on the upper portion 66 of backplane 65 are shown in FIG. 2 as being respectively electromechanically connected with corresponding pairs of terminals 75 on the corresponding circuit sections in bay 50. In such connection, whether the terminal in question is male or female, the term "jack terminal" is used herein to denote a terminal fixedly mounted in housing 40 and the term "plug terminal" is used to denote a terminal which is on a component insertable into housing 40 and which, thus, is plugged into a "jack terminal" thereof when that component is so inserted. The respective electrical connector devices made collectively by terminals 71 and 75 when the latter are plugged into the former are referred to herein as interruptible terminal means, and they are all coaxial connectors.

Those respective electrical connecting devices serve to electrically connect the inputs and outputs of the various signal processing circuit sections 70 to the input and output receptor terminals of the pairs 71 of such terminals on the upper portion 66 of the backplane and corresponding to those sections. Thus, the electromechanical connection of the pair 71a of jack terminals on the backplane 65 with the pair 75a of corresponding plug terminals on circuit section 70a serves to connect input jack terminal 72a through plug terminal 76a with the signal input of circuit pack 70a, and to connect the output jack terminal 73a through plug terminal 77a with the signal output of circuit pack 70a. Similarly, the electromechanical connection of the pair 71f of jack terminals on the backplane with the pair 75f of corresponding plug terminals in the circuit pack 70f serves to connect input jack terminal 72f through plug terminal 76f with the signal input of circuit pack 76f, and to connect the output jack terminal 73f on the backplane through plug terminal 77f with the signal output of circuit pack 70f.

The array 69 of six pairs 71 of coaxial jack terminals on the upper portion 66 of the back plane 65 is duplicated by an array 80 of six respectively corresponding pairs 81a–81f (FIG. 3) of coaxial jack terminals mounted on the lower portion 67 of the backplane to face towards the entrance 61 of guideway 60. Like the upper pairs of terminals, the lower pairs of terminals each consists of an input jack terminal 82 and an output jack terminal 83. Thus, the terminal pair 81a consists of input jack terminal 82a and output jack terminal 83a, and, similarly, the terminal pair 81f consists of the input jack terminal 82f and the output jack terminal 83f. The pairs 71 of upper terminals and corresponding pairs 81 of lower terminals have associated therewith pairs 85 of short coaxial lines of which pair consists of a lefthand line 86 and a righthand line 87 (FIG. 3). The lefthand line 86 of each such pair of coaxial lines connects together the respective input terminals of the two pairs of jack terminals associated with that line, while the righthand line 87 of each such pair of coaxial lines connects together the respective output terminals of the two pairs of jack terminals associated with the last named line. For example, the coaxial line 86a of line pair 85a connects together the input terminals 72a and 82a of jack terminal pairs 71a, 81a while the coaxial line 86f of line pair 85f connects together the input terminals 72f and 82f of jack terminal pairs 71f, 81f. The described array 80 of pairs 81 of jack terminals on the lower portion 67 of the backplane 65 is designed to cooperate with different combinations of $\underline{m}$ modules inserted, one at a time, into guideway 60. The number $\underline{m}$ of modules in each such combination is, it will be noted, the same as the number $\underline{m}$ of signal sources 25 and signal loads 31 in the FIG. 1 system. A first one of such combinations is shown in FIGS. 3 and 5 and will now be described.

The mentioned combination consists of a righthand module 101, a middle, module 102 and a lefthand module 103. These modules may, for reasons which will be later apparent, be referred to as x-way modules where $\underline{x}$ is an integer in the range of integers between and including the integers $\underline{1}$ and $\underline{n}$ where $\underline{n}$ in turn is equal to the number of signal processing circuit sections present in the FIG. 1 system or a like system. Thus the modules 101, 102 and 103 can aptly be described as respectively a "one-way" module, a "two-way" module and a "three-way" module.

Considering first the three-way module 103 in FIG. 5, it includes a hollow generally rectangular case 120a to the back of which are fastened upwardly and downwardly projecting tabs 121a and 122a having horizontal holes (not shown) therein through which screws 123a, 124a may be advanced into threaded holes (not shown) in the shelves 45 and 42 to fasten module 103 in place in guideway 60 when the module has been fully inserted in that guideway.

The front end of case 120a departs from rectangular shape in that it has a forwardly projecting foot 125a with a vertical front face 126a and, at the back of the foot, an upper step 127a providing by its front face 128a a vertical rise from the foot 125a to the top of the case. When module 103 is fully inserted in guideway 60 (FIG. 4), foot 125a extends forwardly through the rear passage 49 in housing 40 to project out slightly beyond the housing's back wall 48 and, at the same time, the front face 128a of the upper step 127a registers with and is presented towards the lower portion 67 of the backplane 65.

Projecting forward from the front face 126a of the foot 125a of case 120a are two terminals 130a and 131a of which the lefthand and righthand ones (FIG. 5) are referred to herein as respectively, the "source" terminal and the "load" terminal because they are designed to be electrically connected to, respectively, one of the sources 25 (FIG. 1) and one of the loads 31. For the purpose of making such electrical connections, the source and load terminals 130a and 131a take the form of exteriorly threaded coaxial fittings upon which may be screwed, respectively, the end couplings 27 on the coaxial conductors 26 to sources 25 and the end couplings 34 on the coaxial conductors 33 to the antenna loads 31.

The module 103 has mounted on it, at its front end by upper step 127a of case 120a, a row of $\underline{x}$ pairs of coaxial plug terminals 141a–146a where such $\underline{x}$ is the number of the "x-way" term as applied to module 103, i.e., in the case of module 103, the integer 3. The three pairs of terminals in such row are the terminals 141a, 142a, the terminals 143a, 144a, and the terminals 145a, 146a. All such terminals are referred to herein as "section" terminals because such terminals are for electrically connecting the module 103 to one of the described circuit sections 70. Among the terminals 141a–146a, the odd numbered terminals and the even numbered terminals (which in FIG. 5 are, respectively, the lefthand terminals and the righthand terminals in the three pairs thereof) are referred to herein as, respectively, input section terminals and output section terminals because they connect the module 103 to, respectively, the inputs and the outputs of three of the circuit sections 70.

In FIG. 5 the showing of housing back wall 48, the lower portion 67 of backplane 65 (see FIG. 4) and the pairs 81 of jack terminals on that lower portion have, for convenience of illustration, been removed. Thus FIG. 5 does not show the jack terminals on the backplane which cooperate with the plug section terminals of module 103. From, however, FIGS. 3, 4 and 11, it is evident that when module 103 is inserted in and fully advanced into guideway 60 the input and output section terminals 141a and 142a on the module plug into, respectively, the input and output jack terminals 82a and 83a on the backplane 65, the input and output section terminals 143a and 144a on module 103 plug into, respectively, the input and output jack terminals 82b and 83b on the backplane, and the input and output section terminals 145a and 146a plug into, respectively, the input and output jack terminals 82c and 83c on the backplane.

To complete the description of the components of module 103, mounted by and secured to the case 120a of the module are an x-way signal divider 150a and an x-way signal combiner 151a where $\underline{x}$ in the case of module 103 is the integer $\underline{3}$. The divider 150a and combiner 151a are conventional coaxial conductor devices commercially available in the form of packaged units. As shown in FIG. 5, the divider 150a is a three-way unit which connects the single source terminal 130a to each of the three input section terminals 141a, 143a and 145a so as to divide RF signals incoming to the source terminal equally among those input section terminals. Similarly the combiner 151a is a three-way unit which connects each of the output section terminals 142a, 144a and 146a to the single load terminal 131a so as to supply amplified RF signals received at all those output section terminals to the load terminal 131a to there be combined at that last named terminal.

From the previous description and the showing of FIG. 11, it is evident that the effect of (a) full insertion of the module 103 into guideway 60 is to plug in section terminals 141a–46a into receptive jack terminals on the backplane as described, and (b) subsequent electrical connection of the source terminals 130a and 131a of the module to, respectively, transmitter unit 25a and antenna 31 is to interpose in the signal path 35a, between that transmitter and antenna, the three RF signal amplifying sections 70a, 70b and 70c so as to provide for the RF signal from transmitter 25a three times the amplifying power which would be available if only one such section were to be in that path. The module 103 thus serves to allocate to signal path 35a one-half of the total amplifying capacity available from the six amplifying sections 70a–70f.

Before preceding to describe the other modules 102 and 101 in the module combination shown in FIGS. 3 and 5 as inserted into guideway 60, it is to be noted that the width w in the longitudinal direction of the module 103 varies directly with the "x" rating of that module and, apart from a slight decrease made in the value of w to provide clearance for the module when inserted in the guideway, bears the same ratio to the total longitudinal width of the guideway between its guide walls 43, 44 as the "x" rating of the module bears to n the total number of circuit sections present in central interconnector 30 to provide its total signal processing capability. Thus, if the width of the guideway 60 between its walls 43, 44 is, say, 12 inches, the width of module 103 is six inches less a small amount to provide clearance for the module in the guideway. To put it another way, if the guideway 60 is considered to have a width of six units (equal to the number n of the sections 70a–70f), then the module 103 has a width of slightly less than three units.

The module 102 is similar in construction to the module 103 with the following difference. The module 102 has an "x" rating of two to be two-way module. Consistent with that rating, the divider 150b of the module is only a two-way divider which connects the source terminal 130b of the module to only two input section terminals 141b, 143b at the front of the module, and the combiner 151b of the module 102 is a two-way combiner which connects only two output section terminals 142b and 144b to the load terminal 131b of the module. The longitudinal width w of module 102 is slightly less than two units if the longitudinal width of guideway 60 is assumed to be six units. The module 102 when fully inserted into guideway 60 serves to interpose in signal path 35b the amplifying sections 70d and 70e so as to provide twofold amplifying power in that path and to allocate one-third of the total amplifying power of unit 30 to path 35b.

In the module 101, there is no dividing or combining of signals. Instead, the "divider" unit 150c in the module provides (FIGS. 5 and 11) a one-to-one connection between the module's source terminal 130c and the input section terminal 141c of the module. Similarly, the "combiner" unit 151c of module 101 provides a one-to-one connection between the module's output section terminal 142c and the module's load terminal 131c. The "x" rating of module 101 is 1 and the longitudinal width of its case is 1 unit less clearance on the basis of guideway 60 having a longitudinal width of six units. While, as stated, the module 101 is not really a signal divider-combiner, it is referred to herein as such for the sake of consistency in grouping module 101 with, say, the modules 103 and 102 which are properly referred to as signal divider-combiners. The module 101 when fully inserted into guideway 60 serves to interpose in signal path 35c the amplifying section 70f so as to provide in that path only the amplifying power of that section and to allocate to that path one-sixth of the total amplifying power of unit 30.

In the use of the combination of the modules 103, 102, 101 in the FIG. 1 system, the coaxial lines 26 and 33 from the transmitter units 25 and antennas 31 are initiallty detached from those modules as shown in FIG. 1. While those lines are so detached, the modules are inserted into the guideway 60 in central interconnector unit 30 to plug the section terminals on the modules one-for-one into jack terminals on the lower portion of the backplane 65 in the unit. Thereby, the amplifier sections 70a, 70b and 70c are electrically connected between the source and load terminals 130a and 131a of module 103, the amplifier sections 70d and 70e are electrically connected between the source and load terminals 130b and 131b of module 102, and the amplifier section 70e is electrically connected between the source and load terminals 130c and 131c of module 101. As the next step, the lines 26 and 33 are electrically connected by their end couplings 27 and 34 to the source and load terminals of the three modules to connect the amplifiers 70a–70c in signal path 35a, the amplifiers 70d and 70e in signal path 35b and the amplifier 70f in signal path 35c, as shown in FIG. 11.

The reason why the particular modules 103, 102 and 101 have been selected for use in interconnection unit 30 and have been electrically connected to the transmitter units 25 and antennas 31 as shown in FIG. 11 is that such selection and connection of the modules is required, or at least desired, because of particular circumstances assumed to be existing at cell site 21 and determining the most efficient manner of transmission of RF signals from the base station at the cell site. Such circumstances may be, say, that because of the topography of the geographic area covered by cell site 21, in order to receive the RF signals with approximately the same field strength in outlying areas of, respectively, the angular sectors 23a, 23b and 23cof the cell site, the RF signals from, respectively, the antennas 31a, 31b and 31c must have transmitted field strengths which are, relatively speaking, the greatest, of intermediate value and the least of such field strengths, and which three transmitted field strengths are properly proportioned in relation to each other by the allocation among the signal paths 35 of different numbers of circuit sections 70 by the combination of modules 103, 102, 101.

It is evident that different cell sites will be characterized by different circumstances as to their topography or the like which will require different permutations of value in the field strengths of the RF signals transmitted from the antennas of the base station at the site in order to realize optimum reception of the signals over the entire site. Some of those permutations in transmitted field strength value can possibly be realized for a new site by the use in interconnector 30 of the same combination of modules 103, 102, 101 as were used for cell site 21. Thus if the new site has angular sectors corresponding in bearing to the sections 23a, 23b, 23c of site 21 and can use the same combination of transmitted field strengths as does site 21, with the sole difference being that, at the new site, the greatest intermediate and least transmitted field strengths are the RF signals transmitted from, respectively, antennas at the new site corresponding to antennas 35c, 35b and 35a at site 21, this requirement can be easily satisfied by connecting the coaxial lines from the transmitter units and antennas at the new site so as to insert the modules 103, 102, 101 at the new site into signal paths corresponding to the paths 35c, 35b and 35a at site 21. In that regard, it is to be noted that the particular order from left to right in which the modules 103, 102 and 101 are placed in guideway 60 is of no consequence since, whatever that order may be, appropriate connections of the conductors 26 and 33 to the the modules may be selected so that the module 103 may be inserted into any selected one of the signal paths leading to the three antennas, with the module 102 being insertable into the selected one of either of the two remaining paths, and with the module 101 being inserted into the remaining path.

It can be reasonably assumed, however, that there are many circumstances other than the one just described where the combination of transmitted field strengths provided by the combination of modules 103, 102, 101 will not be suitable for the site at which the FIG. 1 system is to be installed. Accordingly, the FIG. 1 system includes means for providing a variety of different combinations of m̲ modules usable in connector unit 30 to obtain a corresponding variety of different combinations of transmitted field strengths for the RF signals respectively radiated from the antennas at the base station. Such means comprises a plurality p̲ of modules where p̲ is an integer greater than m̲, and which plurality of modules is referred to herein as the pool 160 of available modules. Such pool 160 is schematically depicted in FIG. 8 and is made up of eleven separate modules (i.e., p̲ equals 11).

Figure 9:
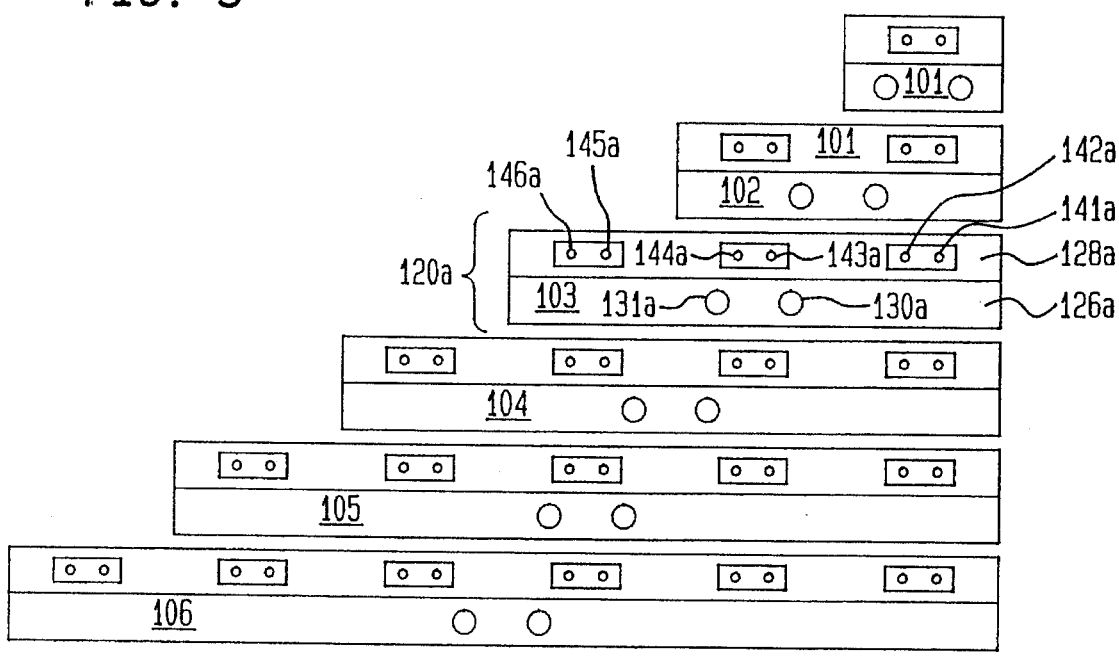
FIG. 9 is a schematic front elevation of the different kind of modules included in the FIG. 8 plurality thereof.
Figure 10:
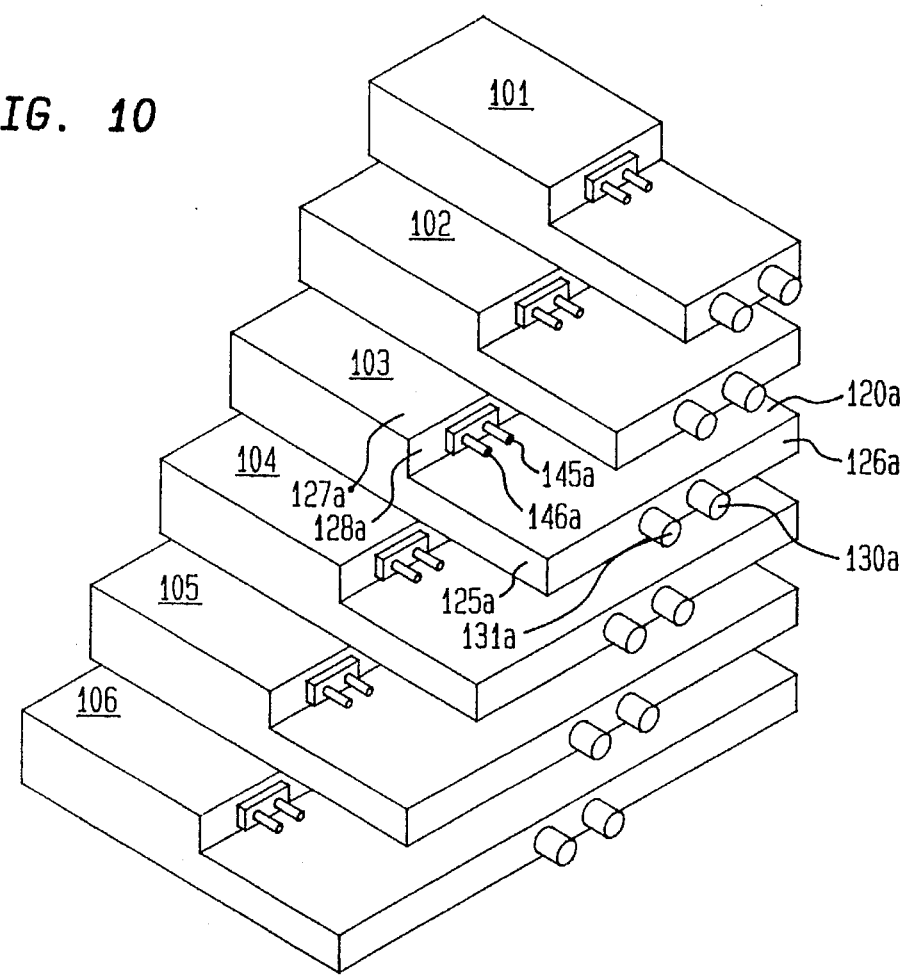
FIG. 10 is an isometric view of the FIG. 9 modules.

In the pool 160, there are six different kinds of modules which are represented by the modules 103, 102, 101 already described and by, also, other modules 104, 105, 106 which are, respectively, a four-way module, a five-way module and a six-way module. FIGS. 9 and 10 depict the modules 101–106 representing those six different kinds of modules. Within those kinds, there are two duplicate three-way modules 103 and 203, three duplicate two-way modules 102, 202, 302 and three duplicate one-way modules 101, 201 and 301. The pool 160 of those eleven modules suffices to provide, by one or more modules therein, all ways which can be used to insert all six or less of the amplifiers 70a–70f in the unit 30 into one or more of the signal paths to the three antennas 31a–31b.

For any module in pool 150, the row of x̲ pairs of section terminals on the module is geometrically congruent in layout with any set of x̲ consecutive pairs 81 of jack terminals in the array 80 thereof on the lower portion 67 of the backplane 65 in housing 40, where x̲ is the same integral number for such pairs of section terminals and for such pairs of jack terminals. That is, provided that the module is aligned relative to the guideway 60 so that the module can be inserted in and advanced into the guideway, all the pairs of input and output section terminals on that module can be plugged into any set of the same number of consecutive pairs of input jack terminals and output jack terminals in the jack terminal array 80 on the backplane.

The module pool 160 is used in the FIG. 1 system by withdrawing from that pool and inserting into the guideway in connector unit 30 that module or combination of modules which will produce the desired transmitted field strength or combination of transmitted field strengths for the RF signals transmitted from one or more of the antennas at the base station of the considered cell site. FIG. 6 schematically shows one of such combinations, formed by withdrawing modules from the pool 160, namely the combination of the five-way module 105 and the one-way module 101. FIG. 7 schematically shows another such combination, namely the combination of the four-way module 104 and the two one-way modules 101 and 201.

From what has been stated, it will be evident that the use in unit 30 of some of the modules in pool 160 will result in cases where there will be no amplifier section 70a–70f inserted into one or more of the signal paths from unit 30 to the antennas of the base station. Thus, if the module 106 is used in unit 30, all six of amplifier sections 70a–70f will be inserted by unit 30 into only one of those paths, and the other two paths are completed by connecting together the coaxial lines 26 and 33 thereof outside of unit 30. A further example is provided by the FIG. 6 module combination for which one of the three signal paths to the antennas will take away amplifier section 70 inserted into the path.

As another consideration, it is possible by the withdrawal from pool 160 and insertion into unit 30 of one or more modules to insert one or ones of the amplifier sections 70a–70f into one or more of the signal paths to the antennas of the base station without utilizing in the FIG. 1 system, the total amplifying capacity provided by all six of those amplifier sections. Such result is realized if, say, in FIG. 7 the module 104 is inserted into guideway 60 without being accompanied by the other modules 101, 201 or if, say, the three one-way modules 101, 201 and 301 are inserted together into the guideway. As before, if it happens in such a case that the insertion of a module or modules into the guideway leaves one or more of the signal paths without at least one amplifier section in it, then those one or more signal paths are completed by connecting together their constituent coaxial lines 26 and 33 outside of unit 30.

On the other hand, it is not possible to withdraw from pool 160 and insert into guideway 60 any combination of modules for which the sum of the numbers of pairs of the section terminals respective to those modules would exceed n̲, the number of amplifying sections in unit 30. That is so because the different longitudinal widths of the modules in pool 160 cooperate to provide a lock-out feature which prevents the guideway from containing any such combination. As an example, assuming, as earlier premised, that the guideway 60 has a longitudinal width of six units, then, since the module 104 has a width of its own of four units less only a clearance, that module when inserted in the guideway 60 (FIG. 7) leaves therein an empty space or spaces having a total width of only two units plus a clearance. The only other modules which can fit into that empty space or spaces are, however, one of the two-way modules 102, 202, 302 or two of the one-way modules 101, 201, 301. In either of such cases, however, the sum of the number of pairs of section terminals respective to all the modules inserted in the guideway will be just equal to n̲, the number of amplifier sections in interconnector unit 30. The described lock-out feature is thus useful not only in preventing unworkable combinations of modules from pool 160 from being inserted in that unit but also in providing guidance as to what module or combinations of modules will, when placed in the unit, allocate all of the total amplifying capacity of unit 30 to one or more of the signal paths to the antennas so as to make full use in the system of that total capacity.

Figure 12:
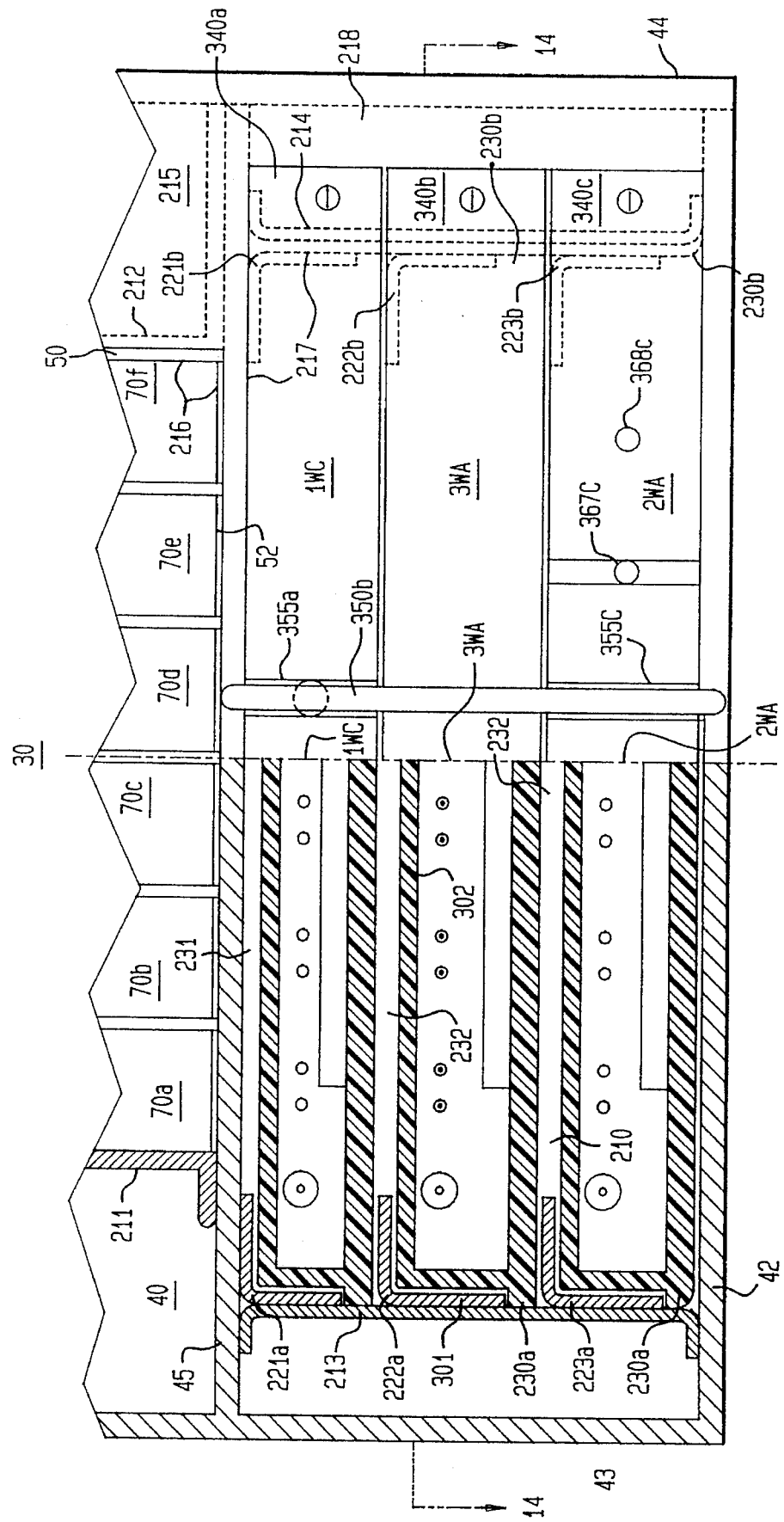
FIG. 12 is a front elevation, partly broken away, of a modification of the FIG. 2 unit, the view being a split view of the lower part of the unit with the lefthand side of the view being taken in cross-section as indicated by the arrows 12—12 in FIG. 14.

The FIG. 12 split-view front elevation shows a modification of the FIG. 2 interconnector unit 30 which enables the coaxial lines 26 and 33 from, respectively, the signal sources 26 and the signal loads 31 (FIG. 1) to be connected continuously to unit 30 while, concurrently, different combinations of m̲ modules may interchangeably be inserted into unit 30 to connect selected different combinations of fractions of the total number n̲ of the signal processing circuit sections 70 into the signal paths 35 between those sources and loads. Differences between the unmodified FIG. 2 unit and the modified FIG. 12 unit are as follows.

In the FIG. 12 modified unit, the outer side walls walls 43 and 44 of the housing 40 of unit 30 are spaced longitudinally further apart than in the FIG. 2 unmodified unit. Further, the upper bay 50 in the housing is bounded on its longitudinally opposite sides by interior vertical walls 211 and 212 disposed longitudinally inward of the outer walls 43 and 44. Upper bay 50 is shown as containing, as before, the signal processing circuit sections 70.

A pair of vertical interior walls 213 and 214, similar to walls 211 and 212, extend between middle shelf 45 and lower shelf 42 and bound longitudinally opposite sides of a lower bay 210 extending vertically between such shelves. The front side of the housing 40 is provided with a front closure wall 215 having rectangular apertures 216 and 217 forming front openings for the bays 50 and 210 and providing left and righthand front panels 2 18 (FIG. 14) longitudinally outward of the lower aperture 217.

Carried by lefthand interior wall 213 are three brackets 221a, 222a and 223a provided by L-channel members. Those brackets have respective vertical webs fastened to the inside of the wall, and respective horizontal webs projecting from wall 213 towards the center of lower bay 210. Brackets 221a, 222a and 223a are vertically spaced to form three keyways 230a between the bottom of the vertical web of each bracket and the top of the bracket next below or in the case of the lowest bracket, the top of the shelf 42.

Righthand interior wall 214 carries three similar brackets 221b, 222b, 223b with respective vertical webs fastened to the inside of wall and with, in addition, respective horizontal webs projecting towards the center of bay 210. Each of the last named brackets is separated from the one next below it, or from shelf 42, by one of three keyways 230b. Both the described brackets and the described keyways extend in the traverse horizontal dimension from the housing's front wall 215 rearward into the housing 40 (FIG. 16) to terminate short of reaching the backplane 65 so as to be separated by the space 51 from the backplane.

The horizontal web of the two brackets in each of the bracket pairs 221, 222 and 223 are at the same vertical level and register with each other to divide the lower bay 210 into three vertically superposed guideways namely, a first or upper guideway 231 extending down from shelf 45 to the top of bracket 222, a second or middle guideway 232 extending down from the top of bracket 222 to the top of bracket 223, and a third or lower guideway 233 extending down from the top of bracket 223 to the top of bottom shelf 42. The guideways 231, 232, and 233 all have the same widths and the same vertical extents. These guideways are widened slightly at their bottom by the keyways 230a and 230b which open into the main space of those guideways on the left and righthand sides thereof.

Turning now to the backplane 65 mounted on the front side of the back wall 48 of the housing 40, the upper portion 66 of the backplane is shown as having therein (FIG. 13), as before, the row 69 of the six pairs 71a–71f of receptor terminals of which each pair consists of an input receptor terminal 72 and an output receptor terminal 73 connected, as earlier described, to, respectively, the signal input and the signal output of the one of the circuit sections 70 corresponding to that pair of receptor terminals. The lower portion 67 of backplane differs however in that the single array or row 80 of pairs 81a–81f of jack terminals on that lower portion (FIG. 3) has been replaced by three arrays or rows (FIG. 13) 236, 237, 238 of pairs of jack terminals each similar to the row of terminals shown in FIG. 3. The three rows of pairs of terminals 236, 237, 238 are located within the respective vertical extents of the three guideways 231, 232 and 233 (indicated in FIG. 13 by dotted lines) to be at the vertical centers of those vertical extents.

The terminal row 236 consists of six pairs 241 of coaxial jack terminals of which the first and last pairs in the row are designated as 241a and 241f. Those six pairs 241 of jack terminals on lower backplane portion 67 each corresponds to (and is connected as later described, to) the one of the pairs of coaxial jack terminals 71 on upper backplane portion 66 shown in FIG. 13 as being located directly above that pair of lower jack terminals. Each of the pairs of lower jack terminals 241 consists of a lefthand (FIG. 13) input jack terminal and a righthand output jack terminal, represented for the terminal pair 241a by, respectively, the input and output terminals 242a and 243a.

The terminal row 237 similarly consists of six pairs 244 of coaxial jack terminals of which the first and last are designated as 244a and 244f. Those six pairs 244 of terminals respectively correspond in order from left to right to the six upper terminal pairs 71. Each of the pairs 244 of terminals consist of a lefthand input jack terminal 245 and a righthand output jack terminal 246 as represented by the input and output jack terminals 245a and 246a shown for pair 244a.

Figure 13:
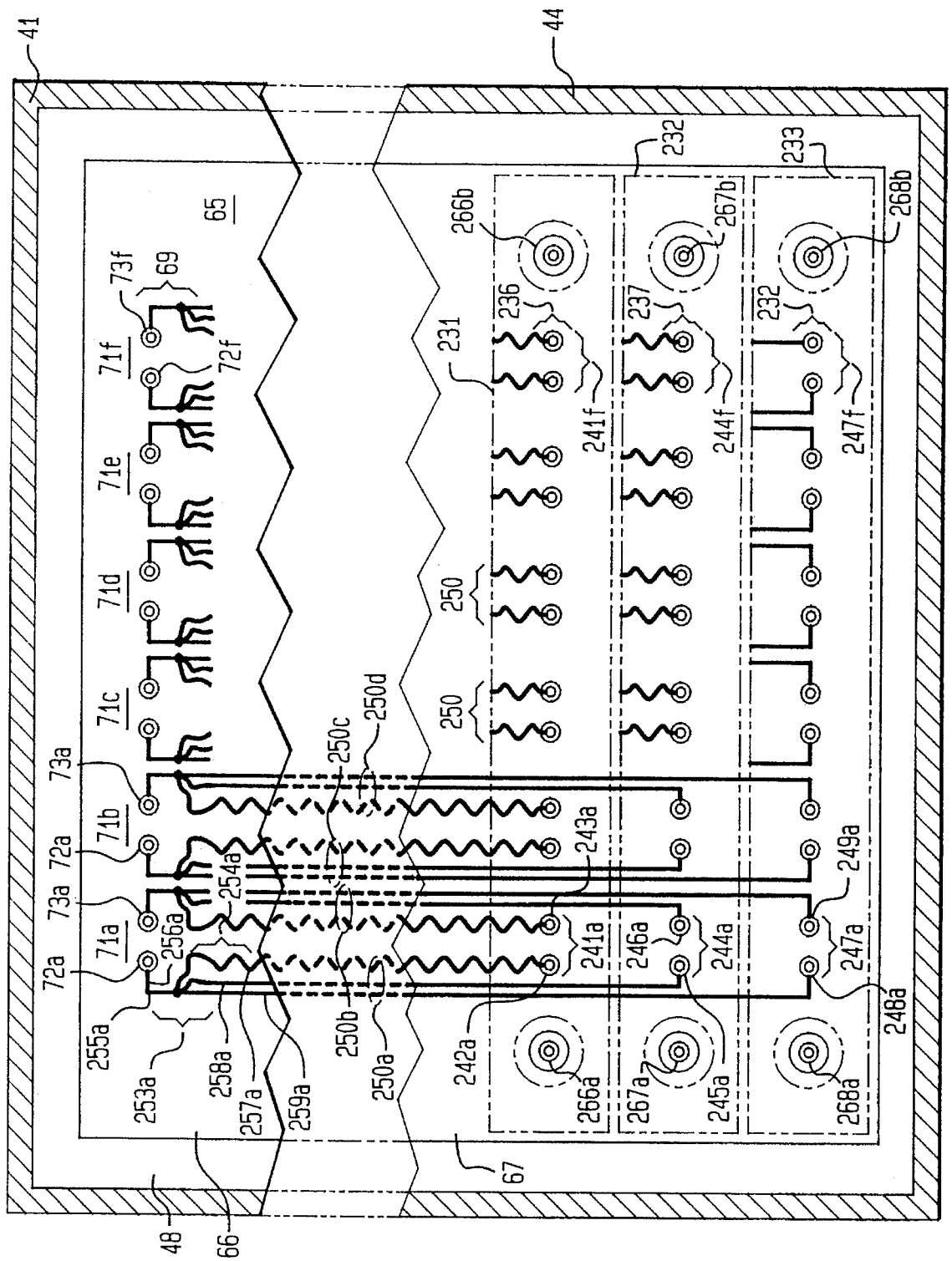
FIG. 13 is a front elevation, partly broken away of the backplane of the FIG. 12 modification.

Finally, the terminal row 238 consists of six pairs 247 of coaxial jack terminals of which the first and last pairs are designated as 247a and 247f, and which six pairs 247 respectively correspond to the six pairs 71 of upper terminals. The pairs 247 of jack terminals each consists, like the others, of a lefthand input jack terminal 248 and a righthand output jack 249 terminal as represented in FIG. 13 by the input and output jack terminals 248a and 249a included in terminal pair 247a.

From the foregoing, it is evident that to each of the upper six pairs 71 of coaxial jack terminals (which are respectively connected to the six circuit sections 70 as earlier described) there respectively corresponds each of a pair 241 and a pair 244 and a pair 247 of lower jack terminals, or three pairs in all of such lower jack terminals. For example, to the upper pair 71a of jack terminals them corresponds the three pairs 241a, 244a and 247a of lower jack terminals. Within the correspondence just described there is the further correspondence that for the input and output jack terminals of each upper terminal pair 71, there corresponds, respectively, the input jack terminal and the output jack terminal of each of the three lower terminal pairs 241, 244 and 247 corresponding to that upper terminal pair. That is, for example, to the upper input jack terminal 72a there corresponds the three lower input jack terminals 242a, 245a and 248a, and to the upper output jack terminal 73a there corresponds the three lower output jack terminals 243a, 246a and 249a.

Each of the two terminals of each of the upper terminal pairs 71 is connected to the respectively corresponding three terminals of the three lower terminal pairs 241, 244 and 247 by a multibranch coupling 250 which is of a character as follows and which will be described in detail in connection with the multibranch coupling 250a, the upper terminal 72a and the lower terminals 242a, 245a and 248a.

The terminal 72a is connected by a short coaxial line 255a to a junction 256a of coaxial lines. The junction 256a is in turn, connected by three separate coaxial lines 257a, 258a and 259a to respectively, the lower terminal 242a, the lower terminal 245a and the lower terminal 248a. Line 255a, junction 256a and lines 257a–259a form the multibranch coupling 250a. The three coaxial lines 257a, 258a and 259a have the relationship that they all have lengths which, mechanically speaking, are the same and, electrically speaking are somewhat less than one one-quarter wavelength at the center frequency of the bandwidth of frequencies of the signals processed by the circuit sections 70. That center frequency may typically be about 900 MHz.

The provision that all of lines 257a, 258a and 259a are of the same mechanical length must be accommodated with the fact that on backplane 65 the lower terminals 248a, 245a and 242a are at different distances from the junction 256a. Such accommodation is made by, say, having their distances such that line 259a stretches with hardly any slack between junction 256a and the lowermost lower terminal 248a. In that case, slack will necessarily exist in the lines 258a and 257a in extending from junction 256a to, respectively, the terminals 245a and 242a. That slack is however, taken up by making the stretch of those coaxial lines, mechanically non-linear as, say, by introducing a certain number of wiggles or other curvature 253a into line 258a and a greater number of wiggles or other curvature 254a into line 257a.

The upper output terminal 73a of the pair 71a of receptor terminals on the upper portion 66 of backplane 65 is connected to the three lower output terminals 243a, 246a and 249a corresponding to that upper output terminal by a multibranch coupling 250 which is a duplicate of the coupling 250a just described. All other upper input and output terminals in the row 69 of pairs of receptor terminals are likewise coupled to their three respectively corresponding terminals, input or output, as the case may be, in the terminal rows 236, 237 and 238 by multibranch coaxial line coupling 250 which are duplicates of the described coupling 250a.

To the left of terminal rows 236, 237 and 238 on backplane 65, the backplane has formed therein three apertures which are at the same levels as those rows, and which provide passages 266a, 267a and 268a extending rearwardly through the backplane and beyond it through the back wall 48 of the unit. Similar passages 266b, 267b and 268b extend through the backplane 65 and back wall 48 to the right of the terminal rows 236, 237 and 238. The passages just mentioned provide receptacles for six coaxial adapters (FIGS. 16 and 17) of which adapters 271a and 271b are on the left and righthand sides of terminal row 236 and correspond to guideway 231, adapters 272a and 272b are on the left and righthand sides of terminal row 237 and correspond to guideway 232, and adapters 273a and 273b are on the left and righthand sides of terminal row 238 and correspond to guideway 233. The vertically middle lefthand adapter 272a comprises (FIG. 14) a threaded coaxial end fitting 274a fastened to and projecting rearwardly from back wall 48, a coaxial conductor portion 275a projecting from such end fitting 274a forwardly through passage 267a to the front side of backplane 65 and a coaxial jack terminal 276a extending forward from portion 275a to project out from the front side of backplane 65 into the guideway 232. The vertically middle righthand adapter 272b similarly comprises a rearwardly projecting threaded coaxial end fitting 274b, a coaxial conductor portion 275b passing through back wall 48 and backplane 65 and a jack terminal 276b projecting from the backplane into guideway 232. The description just given of adapters 272a and 272b is typical of the four other mentioned adapters. The lefthand group 271a, 272a and 273a of adapters and the righthand group 271b, 272b and 273b of adapters are referred to herein as, respectively, the "source" adapters and the "load" adapters because they are (FIGS. 16 and 17) connected to, respectively, the signal sources 25 and the signal loads 31 when the FIG. 12 modified connector unit is put into use.

Figure 18:
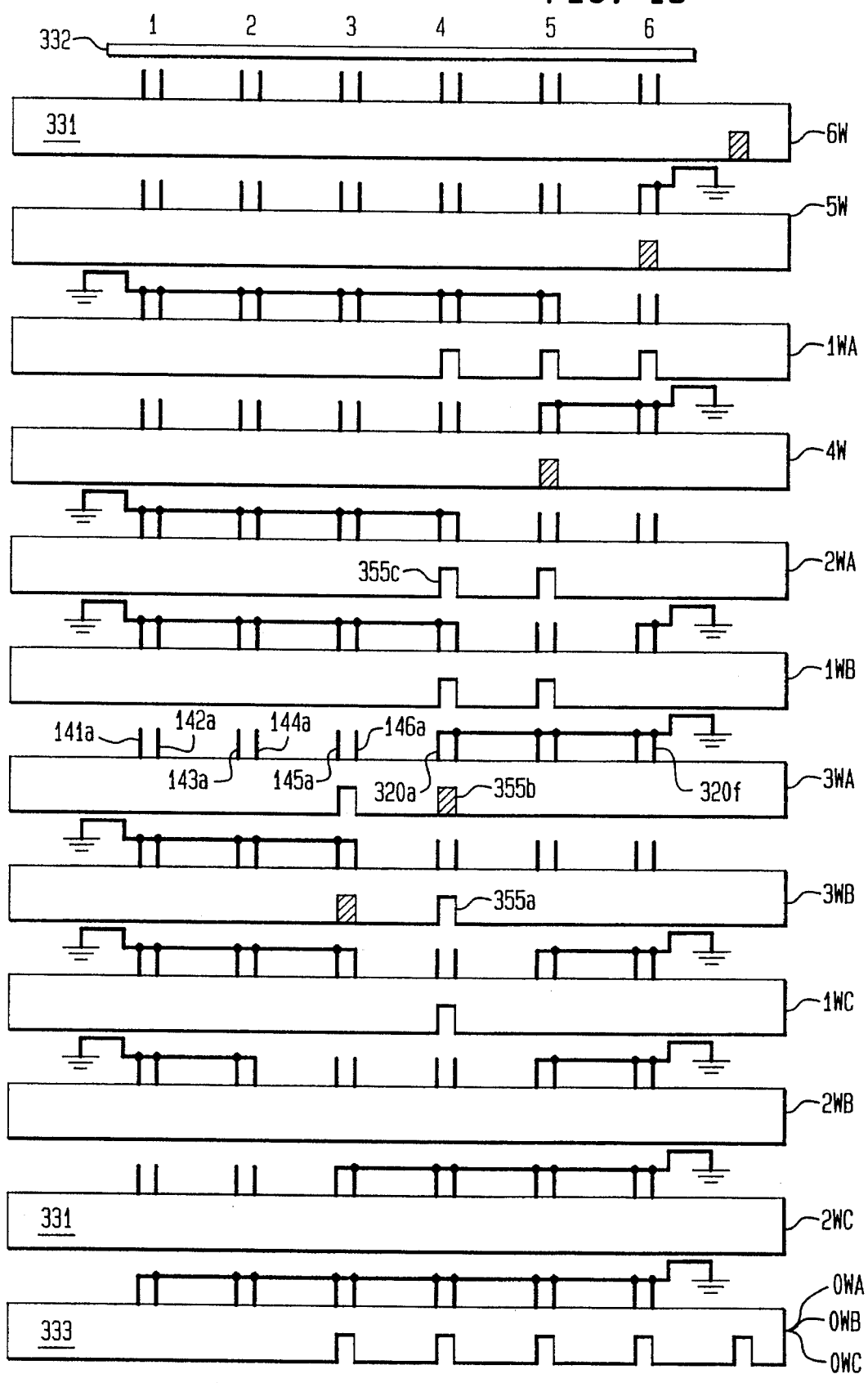
FIG. 18 is a schematic view of the pool of modules usable in connection with the FIG. 12 modification.

Turning now to the modules which are constituents of the modified unit being described, FIG. 12 depicts a condition of that unit in which there have been inserted into the guideways 231,232 and 233 a particular combination of $\underline{m}$ modules consisting of 1-way, 2-way and 3-way modules which are designated herein as, respectively, the modules 1WC, 3WA and 2WA and which are depicted schematically in FIG. 18. Of those three modules, the modules 1WC and 2WA occupy, respectively, the upper guideway 231 and the lower guideway 233 while the 3-way module 3WA occupies the middle guideway 232.

Figure 14:
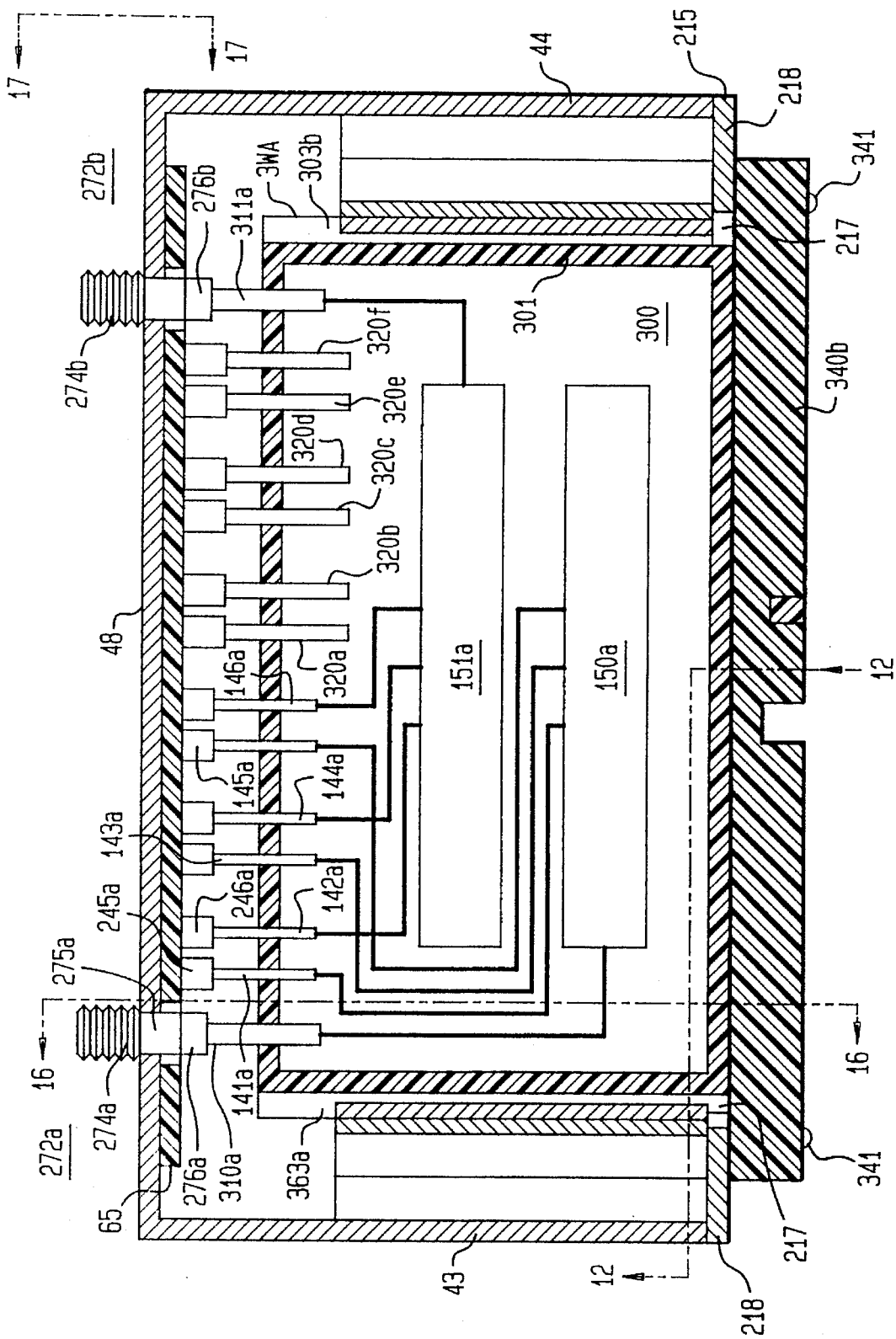
FIG. 14 is a plan view in cross-section, taken as indicated by the arrows 14—14 in FIG. 12, of the FIG. 12 modification.

FIGS. 12, 14 and 16 together show details of the 3-way module 3WA. Similarities and differences between that module and the 3-way modules used in the FIG. 2. interconnector unit are as follows.

Module 3WA has a plastic casing 300 comprising a generally rectangular housing 301 closed by a lid 302 conventionally fastened thereto, and having keys 303a, 303b which project outward in longitudinally opposite directions from the container's bottom, and which keys are fittable into the earlier described keyways 230a, 230b at the sides of each of the guideways 231, 232, and 233. The casing 300 is slidably insertable into each of those guideways and, as an external difference from the module 103 of the FIG. 2 unit, has (except for a small reduction to provide clearance) the same longitudinal width $\underline{w}$ as each of those guideways.

Internally the module 3WA is similar to the module 103 in that module 3WA includes the voltage divider 150a, the voltage combiner 151a and the section terminals 141a–146a, all connected together as earlier described for module 103. When module 3WA is inserted into any of the guideways 231, 232 and 233a the six section terminals 141a–146a are electromechanically coupled by that insertion to the respectively corresponding ones of the six leftmost of the jack terminals in the one of the terminals rows 236, 237 and 238 which is located at the back of the guideway into which the 3WA module has been inserted. It follows that, whether, module 3WA is inserted into guideway 231, 232 or 233, the module's signal transferring section terminals 141a–146a will be electrically connected by various of the described multibranch couplings 250 to respectively corresponding ones of the six leftmost terminals in the upper terminal row 69 and, through those upper terminals, to the three leftmost (FIG. 12) of circuit sections 70 as earlier described.

The 3WA module has its source and load terminals 310a and 311a internally connected to the voltage divider 150a and voltage combiner 151a within the module in the same way as are the source and load terminals 130a and 131a of the module 103. Such terminals of the 3WA module are however different from those of module 103 in that terminals 310a and 311a are not coaxial line end fittings (as in module 103) but, rather, are plug terminals adapted, when module 3WA is inserted into any of guideways 231,232 and 233, to be electromechanically coupled with, respectively, the source adapter corresponding to that guideway and the load adapter corresponding thereto by virtue of being plugged into the jack terminal portions of those adapters. Thus, for example, when the 3WA module is slid into guideway 232 to become fully inserted therein, the source and load terminals 310a and 311a of that module are caused by that insertion (FIG. 14) to become plugged into the jack terminal portions respective to the source and load adapters 272a and 272b associated with guideway 232 to thereby become coupled through those jack terminal portions with the source and load coaxial line end fittings 274a and 274b of such adapters which project outwards from the back of the FIG. 12 unit. It follows that, when the module 3WA is fully inserted in guideway 232 and the coaxial lines 26b and 33b are coupled (FIGS. 16 and 17) to the source and load adapters 272a and 272b associated with that guideway, the effect of the insertion of that module into that guideway is to couple a parallel combination of the signal processing circuit sections 70a, 70b and 70c in series into the signal path 35b (FIGS. 1 and 11) between the signal source 25b and the signal load 31b.

The insertion of the module 3WA into guideway causes as stated the six section plug terminals 141a–147f in the module to become plugged into the six leftmost jack terminals in the vertically middle row 237 of lower jack terminals to thereby connect those six section plug terminals through those jack terminals and their corresponding multibranch couplings 250 to the six leftmost terminals in upper terminal row 69. Accordingly, each of those upper terminals becomes coupled through its associated multibranch coupling to one of the three lower jack terminals corresponding to that upper terminal to thereby establish a path for signal transfer between that upper terminal and the section terminal on the module which is plugged into that lower jack terminal. At the same time, however, that upper jack terminal is also connected through its associated multibranch coupling 250 with two other lower jack terminals which are not, either of them, connected to any section plug terminal on the module 3WA.

For example, while the insertion of module 3WA causes upper jack input terminal 72a to be connected through multibranch coupling 250a and lower jack terminal 245a to the section plug terminal 141a on the module to set up a signal path between elements 141a and 72a, the upper terminal 72a s also then connected through multibranch coupling 250a with the two other lower jack terminals 242a and 248a which are not coupled to any section terminals on module 3WA so as to have no signal paths established through those two other lower terminals. That condition may, however, create impedance mismatches in multibranch coupling 250a which may detrimentally affect the flow of current between the upper receptor terminal 72a and the section terminal 245a on module 3WA which is connected to that receptor terminal. Elimination or reduction of such possible impedance mismatches is accomplished in a manner as follows.

The module 3WA not only includes the six signal transferring section terminals 141a–141f at positions corresponding to the six leftmost terminal portions in terminal row 69 but, in addition, includes six more shorting terminals 320a–320f at the six positions in the module corresponding to the six rightmost terminal positions in terminal row 69. The shorting terminals 320a–320f each consists of a stub length of coaxial link which, as shown by FIG. 15 for terminal 320a, consists of a grounded tubular outer conductor 321a, an inner filamental conductor 322a, insulation 323a between the two conductors and a current short which extends at the free end of the stub link between the two conductors, and which is depicted in FIG. 15 as a metal wire 324a (although it may be otherwise provided as, say, by a solder deposit covering the free end of terminal 320a).

It was earlier mentioned that, in the multibranch couplings 250a, the three branch coaxial lines 257a, 258a and 259a which extend from junction 255a to, respectively the lower terminals 242a, 245a and 248a are each of the same mechanical length but, in electrical length, are somewhat less than one-quarter of a wavelength at the center frequency of the bandwidth of the frequencies of the signal processed by the circuit sections 70. The stub coaxial lines of terminals 320a–320f are, however, each of an electrical length (all those lines being of the same mechanical length) which makes up the difference between one-quarter wavelength at that center frequency and the amount by which branch lines 257a, 258a and 259a are less than one-quarter wavelength at that frequency. Hence, if any such branch line is connected to a shorting terminal having the same mechanical (and electrical) length as that of any of the terminals 320a–320f, the combination together of the electrical length of such line and the electrical length of such shorting terminal will exactly equal one-quarter of the wavelength of the signal at that center frequency. That being the case, however, and looking into that branch line from junction 256a, the impedance for that line is seen from the junction as being an "open" or theoretically infinite impedance. Accordingly, no impedance mismatch is introduced into that multibranch coupling by such branch line because of such branch line not being coupled through its lower jack terminal to a section terminal on a module.

Now, it will be evident that, if the module 3WA alone is considered, the presence in that module of the six shorting terminals 320a–320f does nothing to prevent an impedance mismatch occurring in multibranch coupling 250a because, when that module is inserted into guideway 232, the branch lines 257a and 259 are not connected through the associated lower terminals 242a and 248a with any shorting terminals in the module 3WA. That inability of the shorting terminals in the module 3WA to solve that particular problem is, however, readily overcome by the fact that the other modules 1WC and 2WA received in, respectively, the upper and lower guideways 231 and 232, do, between them, provide all the shorting terminals needed to overcome that problem. That is, the module 1WC has shorting terminals at all positions for pairs of terminals corresponding to the positions shown in FIG. 13 for the six pairs of terminals in row 69 except for the fourth position from the left for such a pair of terminals and, further, the module 2WA has shorting terminals at all positions for pairs of terminals corresponding to the positions shown in FIG. 13 for the six pairs of terminals in row 69 except for the fifth and sixth positions from the left for such pairs of terminals. Hence, when module 3WA is inserted into guideway 232 so as to connect its six section terminals 141a141f to the six corresponding receptor jack terminals in row 69 through the six leftmost multibranch couplings 250, the branch lines in those couplings 250 which do not effect such connections between such receptor terminals and such section terminals, are nonetheless, effectively terminated by shorting terminals in modules 1WC and 2WA so as, together, with those shorting terminals, to provide one-quarter wavelength lines which appear as "opens" at the junction in those couplings 250 and, which thus, do not introduce any significant impedance mismatches into those couplings 250.

To generalize the foregoing, while the modules used with the FIG. 12 modified unit are x-way modules in the same way as are the modules used with the FIG. 2 unit in that both sets of modules include modules having different numbers x of pairs of section terminals, the two sets of modules are different in that the modules for the FIG. 12 unit each also includes n-x shorting terminals. Hence, in all the modules for the FIG. 12 unit the total number of plug terminals provided by each module, excepting its source and load terminals, is always equal to n.

As another difference between the modules for respectively, the FIG. 2 unit and the FIG. 12 unit, in some of the modules for the FIG. 12 unit, the value for "x" for the module may be zero with the result that the terminals of that module consist, (with the exception of its source and load terminals) entirely of shorting terminals. In the case of those zero-way modules, the source and load terminals of those modules are directly connected together through coaxial lines (not shown) provided within the modules.

FIG. 18 is a schematic diagram of the pool 330 of modules which is provided with the FIG. 12 unit, and from which pool various different combinations of m modules may be withdrawn to be inserted into, and concurrently occupy, the m guideways in the FIG. 12 housing 40. In FIG. 18, the modules in pool 330 are represented by eleven horizontally elongated blocks 331 extending down in a column below a smaller horizontal bar 332 and by, also, a twelfth such block 333 disposed at the bottom of the column below blocks 331. Each of the eleven blocks 331 represents a respective one of the modules in the pool 330. The block 333, however, represents three zero-way modules which are separate articles but which are otherwise identical with each other. Thus, the pool 330 of modules consists of fourteen modules, namely, the eleven modules respectively corresponding to the eleven blocks 331 plus the three modules all corresponding to block 333.

In FIG. 18, the schematically represented modules are designated by reference identifications of which the first two reference characters indicate the x-rating of the designated module. For example the module designated "6W" is a six-way module, and the module designated "4W" is a four-way module. The following in the reference identification of the first two reference characters by an alphabetical suffix means that the designated module is one of a plurality thereof having the same x-rating. For example, there are two three-way modules designated as, respectively, 3WA and 3WB, three two-way modules designated as, respectively, 2WA, 2WB and 2WC and three zero-way modules designated as, respectively, 0WA, 0WB and 0WC.

The eleven different modules represented in FIG. 18 by the blocks 331 are, in certain respects, counterparts of and similar to the eleven different modules included in the pool 160 of modules (FIG. 8) provided for the FIG. 2 unit. Specifically, the three-way modules 3WA and 3WB include section terminals, voltage dividers, voltage combiners, and interconnections of those circuit elements with each other (and with the source and lead terminals of the module) which are all the same in kind as those included in the three-way modules 103 and 203 contained in the module pool 160 for the FIG. 2 unit. What has just been said is true also for all the other modules which are respective to the two pools and have the same x-ratings such as, for example, the one-way modules 101, 201 and 301 in pool 160 and the one-way modules 1WA, 1WB and 1WC in pool 330. In other respects, however, the modules in pool 330 differ from those in pool 160 as follows.

All the modules other than 3WA and in pool 330 have casings and source and load terminals which are duplicates of the casing and source and load terminals of module 3WA. Also, all those other modules in pool 330 are duplicates of module 3WA to the extent that they have, excluding their source and load terminals, n pairs of plug terminals which project out from the module, and which consist of x pairs of section terminals and n-x pairs of shorting terminals where x corresponds to the X-rating of the module. Thus, any of the modules in pool 330 are interchangeably insertable in any of the three guideways 231, 232, and 233 of the FIG. 12 unit so that (a) the source and load plug terminals on the module will plug into the jack terminal portions of the source and load adapters associated with that guideway, and so that (b) the n pairs of section and shorting terminals on the module will plug into respectively corresponding ones of the n pairs of jack terminals included in the one of the terminal rows 236, 237 and 238 which projects out from backplane 65 and corresponds to that guideway.

As another difference from the modules of the same x-rating which are included in the pool 160 for the FIG. 2 unit, and in which their respective section terminals are all similarly located within those modules (the respective pairs of section terminals of one-way modules 101, 201 and 301, for example, all having the same relative location in the widths of those several modules), each module in the pool 330 for the FIG. 12 unit has (unless it is a zero-way module) a distribution of the locations in the width of that module of the one of more pairs of section terminals thereof which is a distribution unique to that module.

Such uniquely different distributions in the pairs of section terminals of the eleven modules 331 is schematically represented in FIG. 18 as follows. The numerals "1" through "6" which appear in FIG. 18 above bar 332 represent the respective horizontal locations in upper terminal row 69 on backplane 65 (FIG. 13) of the six pairs of receptor terminals 71a–71f included in that row. The upper side of each of the blocks 331 and 333 in FIG. 18 represents the side of the corresponding module which is presented towards the backplane 65 when that module is inserted into one of the guideways of the FIG. 12 unit. For any of such blocks 331 and 333, a pair of terminals (schematically represented in FIG. 18 by a pair of parallel lines) which is (a) shown as projecting out from the upper side of that block and (b) is vertically aligned with one of the mentioned locations "1" through "6" is a pair of section terminals or shorting terminals on the corresponding module which, when the module is inserted into a guideway in the FIG. 12 unit, is coupled by a multibranch coupling 250 to the pair of receptor terminals 71 which is at that location in the upper terminal row 69. As a further convention employed in FIG. 18, pairs of terminals which project out from a block 331 or 333, and which are shown as being grounded are shorting terminals while, if not so shown as being grounded, they are section terminals.

From the description just given and from inspection of FIG. 18, it will be evident that no two of the eleven modules represented by the blocks 331 have the same distribution in the width of the module of pairs of section terminals. On the other hand all three of the zero-way modules have the same distribution of such terminals.

Returning to a consideration of FIG. 14 in order to complete the description of the module 3WA, the module has conventionally fastened to the front side of its container 301 a plastic faceplate 340b which, at its longitudinally opposite ends, extends outwards of the container to have portions overlapping with the panels 218 of the front closure wall 215 of housing 40. Screws 341 are passed through those overlapping portions and into the panels to secure the module within whichever of the guideways 231, 232 and 233 it has been slid into. Every other module in the pool 330 has a similar faceplate 340 which is screwable to the front wall 215 to secure that module within the guideway into which it has been inserted.

In the absence of measures being taken to prevent it, it is possible to inadvertently select for insertion into the FIG. 12 unit a combination of three modules which, when inserted will cause a circuit section 70 (or more than one of them) to be simultaneously electrically coupled with two or more of the inserted modules. For example, from inspection of FIG. 18 it is evident that, if the combination of modules 1WC, 3WA and 2WA in, respectively, the upper, middle and lower guideways 231, 232 and 233 is changed by substituting for the original two-way module 2WA the other two-way module 2WB, then the circuit section 70c would be coupled, through the pair 71c of upper receptor terminals and the multibranch couplings 250 serving that pair of terminals, to the pair of lower jack terminals projecting into guideway 232 and corresponding to upper terminal pair 71c and, also, the pair of lower jack terminals projecting into guideway 233 and corresponding to upper terminal pair 71c so as, thereby, to be coupled to two modules, namely, module 3WA and module 2WB. Ordinarily, however, it is not desirable for them to be an overlapping coupling of any circuit section 70 with two or more modules inserted into the FIG. 2 unit.

To prevent the occurrence of any such overlapping, the faceplates of the modules of pool 330 are designed to collectively provide a lock-out effect which prevents any two modules to both be fully inserted into respective ones of the guideways 231, 232 and 233 if the effect of the full insertion therein of those modules would be to simultaneously couple any circuit section 70 to both of those modules. Such lock-out feature is implemented in a manner which is as follows, and which is exemplified by the design of the faceplates for the modules 1WC, 3WA and 2WA.

The faceplate 340b of module 3WA is molded to include as an element a vertical plastic stop bar 350b (FIG. 12) extending in the transverse horizontal dimension of the faceplate from its outer surface transversely inward for about half the transverse thickness of the plate. The bar 350b is schematically depicted in FIG. 18 wherein the under surfaces of the blocks 331 and 333 represent the outer surfaces of the faceplates of the corresponding modules. In the longitudinal horizontal dimension of the faceplate, the bar 350 is located at the position #4 shown at the top of FIG. 18. In the vertical dimension, the bar 350b extends (FIG. 12) both up and down far enough from the main body of the faceplate that if the module 3WA were to be placed in the upper guideway 231, the bar would project for at least a short distance into the vertical extent occupied by the lower guideway 233, and conversely.

The presence of the bar 350b on the faceplate of module 3WA will prevent that module from being inserted into any of the guideways of the FIG. 12 unit of either of the modules in the other two guideways of that unit has an unbroken front surface at the horizontal longitudinal location of such bar. That is so, because such unbroken front surface will be contacted by the inner side of the bar to thereby stop further inward movement of the bar and, accordingly, full insertion into the unit of the module. In other words, the module 3WA will be "locked out" so as to indicate that the combination of modules sought to be inserted into the FIG. 12 unit is a defective combination.

In the case, however, of the combination of the modules 1WC, 3WA and 2WA shown in FIG. 12 as being inserted into the housing 40, the faceplate 340a of the module 1WC has formed therein, at the longitudinal horizontal location of bar 350b and at the outer surface of plate 340a, an inwardly extending vertical notch 355a passing from the bottom to the top of the faceplate and providing a receptacle for containing the full horizontal transverse extent of the portion of bar 350a which registers with that notch. A similar notch 355c is formed in the faceplate 340c of the module 2WA in the lower guideway 233, both of notches 355a and 355c being depicted in FIG. 18. Thus when the module 3WA is sought to be inserted into a guideway of the FIG. 12 unit after the modules 1WC and 2WA have been inserted therein, the module 3WA is not stopped by its faceplate bar 355b from being fully inserted into the guideway selected for it and, the module 3WA is, therefore, capable of producing by its insertion a full electromechanical contact between the plug terminals projecting from the module and the jack terminals in housing 40 at the back of that guideway. It is noted in such connection that such avoidance of lock-out of the module 3WA is realized for any permutation in the positioning of the modules 1WA, 3WA and 2WA in the guideways 231, 232 and 233 of the unit.

FIG. 18 shows, for all of the modules corresponding to blocks 331 and 333, the stop bars 350 and notches 355 which, are provided in the faceplates of modules to (a) effect lock-out of all combinations of $\underline{M}$ modules drawn from pool 330 which would result in the coupling of any circuit section 70 to more than one module and yet (b) avoid lock-out of combinations of modules which will enable desired numbers x1, x2 and x3 of circuit sections 70 to be respectively connected into selected ones of the signal paths 35a, 35b and 35c where x1, x2 and x3 are of course integers, of which the sum is equal at most to $\underline{n}$.

In order to more easily determine which combinations of $\underline{m}$ modules are consistent with each other in the sense that they may be used together without producing a coupling of any circuit section 70 to two more of such modules, the front surfaces of the faceplates of each of those modules may have indicia thereon of the location at the inner end of the module of the one or more pairs of plug-in section terminals carried by that module. For example (FIG. 12) the faceplate 340a of module 1WC has molded on its outer surface a circle 366a (in notch 355a) indicating that module 1WC has a pair of section terminals at the location #4 shown in FIG. 18, and the faceplate 340c of module 2WA has molded on its outer surface the circles 367c and 368c indicating that module 2WA has a pair of section terminals at each of locations #5 and #6 shown in FIG. 18. If any two such circles on, respectively, the faceplates of one and the other of two modules (drawn from pool 330) are circles which overlap in their horizontal locations on such faceplates, it is indicated by such overlap that such two modules, if included in a proposed three module combination for the FIG. 12 unit, will render that combination inconsistent in the sense stated above. Therefore, the employment of those circles or similar functioning indicia on the faceplates of the modules facilitates separating inconsistent combinations of $\underline{m}$ modules from consistent combinations thereof.

From the foregoing description of the FIG. 12 modification of the interconnector unit 30, it is evident that the use of the modified unit permits the signal sources 25 and signal loads 31 (FIG. 1) to be continuously connected through coaxial lines 26 and 33 to the unit while, concurrently, changes may be made as often as desired in the number of the $\underline{n}$ circuit sections which are each connected into a respective one of the separate signal paths 35 between those sources and loads. Moreover, by the employment of the described zero-way modules, respective ones of such sources and loads may so continuously connected with each other by a signal path 35 which passes through the modified unit but which does not include any of the circuit sections 70.

The above described embodiments being exemplary only, it is to be understood that additions thereto, omissions therefrom and modifications thereof can be made without departing from the spirit of the invention and that, accordingly, the invention is not to be considered as limited save as is consonant with the recitals of the following claims.

We claim:

1. A signal processing allocator unit comprising:

housing means, a plurality $\underline{n}$ in said housing means of signal processing sections where $\underline{n}$ is an integer, a plurality $\underline{m}$ of guideways extending into said housing means where $\underline{m}$ is an integer smaller than $\underline{n}$, a plurality of $\underline{m}$ pairs, respectively corresponding to said $\underline{m}$ guideways, of electrical connector means constituting fixtures of said housing means for coupling said allocator unit into m paths for conveying signals between points external to said allocator unit;

a combination of m modules insertable into respective ones of said m guideways, each of said modules containing circuits for selecting x of said signal processing sections for connection in parallel between two connector means of one of said pairs of electrical connector means where x is an integer characterizing that module and in a range of integers extending between and including the numbers 0 and n, and terminal means in said housing means and on said m modules and effective for each of said modules when inserted into one of said m guideways for so connecting in parallel between the two connector means corresponding to that guideway a number of said signal processing sections which is equal to the number x characterizing that module.

2. An apparatus for allocating signal processing capability among a plurality of m of paths for conveying signals between points external to said apparatus where m is an integer, said apparatus comprising:

a housing, a plurality n in said housing of signal processing circuit sections together providing said capability, n being an integer greater than m, a combination of m separately portable modules for insertion into said housing, each module being coupled by said insertion thereof with x of said signal processing circuit sections made respective to that module by being coupled thereto where x is an integer having a numerical value characterizing that module and in a range of possible numerical values for x of which the greatest value in the range is n, a sum of the x values respectively characterizing said m modules being at most equal to n, each module comprising circuits, wherein said circuits are effective when said x sections respective to that module are coupled thereto to connect said x sections together to form a combination thereof.

3. An electrical system comprising, a plurality of m sources of signals where m is an integer, a plurality of m loads for said signals, a plurality of n signal processing circuit sections where n is an integer greater than m, a combination of m separately portable signal divider-combiner modules of which each module comprises; a source terminal, a load terminal, a plurality of x pairs of plug terminals where x is an integral number characterizing said module and is in the range of integers between and including the integers 1 and n, each of said pairs of plug terminals consisting of an input plug terminal and an output plug terminal to said load terminal, a divider unit electrically connecting said source terminal to all said input plug terminals, and a combiner unit electrically connecting all said output plug terminals to said load terminal, said modules having front ends at which said pairs of plug terminals of said modules are disposed said system further comprising, interconnecting means for electrically connecting each of said sources to a different one of said loads via a signal path extending therebetween by interposing in each of said paths a selected one of such modules to connect that module by its source and load terminals to, respectively, the source and load at opposite ends of that path, and by connecting the x input section terminals and the x output section terminals of that module to the inputs and outputs, respectively, of an equal number x of said signal processing sections, said interconnecting means comprising a central interconnector unit comprising;

a housing having first and second vertically opposite ends and a front and back which are spaced in a first direction, a guideway in said housing having at the front thereof an entrance, said guideway being disposed vertically between said housing ends and having spaced vertically opposite sides and spaced longitudinally opposite sides in a second direction and said guideway transversely extending from said entrance rearward into said housing, an insulative backplane disposed in said housing at the back thereof and vertically extending from said first end of said housing sufficiently towards said second end thereof to position between said vertically opposite sides of said guideway a first portion of said backplane disposed to bound the back end of said guideway by a side of said backplane facing towards said entrance, and an array of n pairs of jack terminals mounted on said forward portion of said backplane on said side thereof and respectively corresponding to said n signal processing sections, each pair of said jack terminals consisting of an input terminal and an output terminal electrically connected with the input and output, respectively, of the corresponding signal processing section, and said combination of said modules being disposed in said guideway so that each pair of plug terminals on each of said modules is electromechanically connected with a respective pair of jack terminals on said backplane portion to connect together the respective input terminals of these two pairs and the respective output terminals of those two pairs.

4. A system according to claim 3 wherein said sources are sources of RF signals on a carrier, said signal processing sections comprise stages for amplifying said RF signals, and said loads are antennas for radiating said RF signals into space.

5. A system according to claim 4 wherein said antennas are disposed adjacent a center of a cell site for cellular telephony, said antennas radiating respective directive radiation patterns away from said center primarily into different angular sectors around said center.

6. A system according to claim 3 in which said forward portion of said backplane projects from one of said vertically opposite sides of said guideway only part way to the other of said sides so as to have a vertical gap between said portion and that other side, said housing has therein a rear passageway communicating with and of smaller vertical size than, said guideway and extending transversely through said gap and through the back of said housing to the exterior thereof, said modules being inserted in said guideway, said source and load terminals being positioned to extend through said passageway to project outwards of said back of said housing.

7. A system according to claim 3 wherein said housing comprises a bay having an access opening thereto at the front of said housing and vertically disposed between said guideway and said first end of said housing, said backplane has a vertically rearward portion disposed to bound the back end of said bay by a side of that portion facing said opening, said side of said portion facing said opening having mounted thereon an array of n pairs of interruptible terminal means respectively corresponding to said $\underline{n}$ pairs of jack terminals and respectively electrically connected to said $\underline{n}$ jack terminals by conductor means on said backplane, and in which said $\underline{n}$ signal processing sections consist of $\underline{n}$ circuit packs received in said bay and connected through said $\underline{n}$ interruptible terminal means and said conductor means to said $\underline{n}$ jack terminals.

8. A system according to claim 3 in which said system comprises a pool $\underline{p}$ of modules where $\underline{p}$ is an integer greater than $\underline{m}$, and which pool includes said combination of $\underline{m}$ modules disposed in said guideway, different modules in said pool thereof having different integral values for the number $\underline{x}$ of pairs of section terminals per module, and in which said combination of modules disposed in said guideway is one of a plurality of different combinations of said modules inserted one at a time into said guideway so that said section terminals on each inserted module are electromechanically connected with said jack terminals in said guideway, each different combination comprising a combination of a number $\underline{m}$ of said modules from said pool p of modules which have respective numbers $\underline{x}$ of pairs of section terminals per module, and $\underline{a}$ sum of which respective numbers $\underline{x}$ is at most equal to $\underline{n}$.

9. A system according to claim 8 in which said system comprises lock-out means connected to said guideway to limit admittance into said guideway to only those combinations of $\underline{m}$ modules for which the sum of their respective numbers $\underline{x}$ is at most equal to $\underline{n}$.

10. A system according to claim 8 in which said sum is equal to $\underline{n}$.

11. A system according to claim 10 in which said guideway is bounded at said longitudinally opposite sides thereof by a pair of longitudinally spaced guide walls extending from said entrance transversely rearward into said housing, each module comprises a rectangular case having fastened thereto the other elements of that module and having a width and depth respectively extending in the first and second directions of said guideway when said module is inserted thereinto, and which widths are of such respective sizes that said guideway will admit between said guide walls thereof only combinations of $\underline{m}$ modules in which the sum of their respective $\underline{x}$ numbers is at most equal to $\underline{n}$.

12. An interconnector module comprising:
 a case,
 source and load terminals disposed outside said case and electrically connectable to, respectively, a source of signals and a load for signals,
 a plurality of pairs of section terminals disposed in an array thereof on the outside of said case, each of said pairs of section terminals consisting of an input section terminal and an output section terminal electrically connectable to, respectively, an input and an output of an electric circuit section for processing signals, a signal divider unit mounted in said case and electrically connecting each of said input section terminals to said source terminal, and a signal combiner unit mounted in said case and electrically connecting each of said output section terminals to said load terminal.

13. A module according to claim 12 wherein said case has a front end and a rear end transversely spaced from each other, said array of said pairs of section terminals is disposed on the front end of said case, and said source terminal and load terminal are also disposed on the front end of said case.

14. Interconnecting apparatus comprising:
 a housing,
 a plurality in said housing of $\underline{n}$ similar signal processing circuit sections where $\underline{n}$ is an integer,
 a guideway in said housing extending from an entrance therefor into said housing and having therein rearward of said entrance an array of $\underline{n}$ pairs of fixedly positioned jack terminals facing towards said entrance, and of which each pair thereof consists of an input jack terminal and an output jack terminal electrically connected to an input and output, respectively, of a corresponding one of said sections, and
 a combination disposed in said guideway of $\underline{m}$ separately portable signal divider-combiner modules where $\underline{m}$ is an integer less than $\underline{n}$, each of said modules comprising; a source terminal, a load terminal, an array of $\underline{x}$ pairs of section terminals where $\underline{x}$ is an integer characterizing that module and in a range of integers extending between and including the numbers $\underline{1}$ and $\underline{n}$, each pair of said section terminals consisting of an input section plug terminal and an output section plug terminal, and separate signal divider and combiner units respectively connecting the source and load terminals of that module to, respectively, all the input section terminals thereof and all the output section terminals thereof, each pair of section terminals of that module being plugged into a pair of said jack terminals in said guideway to connect together the input terminals respective to those two pairs and the respective output terminals respective to those two pairs, said apparatus further comprising a pool p of modules where p is an integer greater than m, and which pool includes said combination of m modules disposed in said guideway, different modules in said pool thereof having different integral values for the number x of pairs of section terminals per module, and in which said combination of m modules disposed in said guideway is one of a plurality of different combinations of m modules inserted into said guideway so that said plug terminals on each inserted module are electromechanically connected with mating jack terminals in said guideway, each different combination comprising a combination of a number m of said modules from said pool p of modules which have respective numbers x of pairs of section terminals per module, and a sum of which respective numbers x is at most equal to n.

15. A system according to claim 14 in which said apparatus comprises lock-out means connected to said guideway to limit admittance into said guideway to only those combinations of $\underline{m}$ modules for which the sum of their respective numbers $\underline{x}$ is at most equal to $\underline{n}$.

\* \* \* \* \*